US012652807B2

(12) United States Patent
Iwasaki et al.

(10) Patent No.: US 12,652,807 B2
(45) Date of Patent: Jun. 9, 2026

(54) MEMORY DEVICE

(71) Applicant: Kioxia Corporation, Tokyo (JP)

(72) Inventors: Takeshi Iwasaki, Kuwana (JP); Yosuke Matsushima, Yokkaichi (JP); Katsuyoshi Komatsu, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 362 days.

(21) Appl. No.: 18/345,266

(22) Filed: Jun. 30, 2023

(65) Prior Publication Data

US 2024/0099020 A1 Mar. 21, 2024

(30) Foreign Application Priority Data

Sep. 21, 2022 (JP) ................................. 2022-150282

(51) Int. Cl.
H10N 70/00 (2023.01)
H10B 61/00 (2023.01)
(52) U.S. Cl.
CPC .................................... H10B 61/10 (2023.02)
(58) Field of Classification Search
CPC .............. H10N 70/881; H10N 70/883; H10N 70/8833; H10N 70/826; H10N 70/20
See application file for complete search history.

(56) References Cited

U.S. PATENT DOCUMENTS

| | | |
|---|---|---|
| 9,960,350 B2 | 5/2018 | Ha |
| 10,217,797 B2 | 2/2019 | Kim et al. |
| 11,271,040 B1 | 3/2022 | Stewart et al. |
| 2011/0068319 A1 | 3/2011 | Tsukamoto et al. |
| 2017/0213869 A1 | 7/2017 | Read et al. |
| 2017/0338279 A1 | 11/2017 | Yang et al. |
| 2018/0212147 A1 | 7/2018 | Ruiz et al. |
| 2019/0172871 A1 | 6/2019 | Yang et al. |
| 2020/0350498 A1 | 11/2020 | Ohba et al. |

(Continued)

FOREIGN PATENT DOCUMENTS

| | | |
|---|---|---|
| CN | 112635516 A | 4/2021 |
| CN | 114762123 A | 7/2022 |

(Continued)

OTHER PUBLICATIONS

Brasted, Robert C.. "selenium". Encyclopedia Britannica, Aug. 29, 2025, https://www.britannica.com/science/selenium. Accessed Sep. 8, 2025. (Year: 2025).*

(Continued)

*Primary Examiner* — Reema Patel
(74) *Attorney, Agent, or Firm* — Maier & Maier, PLLC

(57) ABSTRACT

According to one embodiment, memory device includes a first, second, and third conductive layers in this order, a resistance change layer between the first and the second conductive layers, and a switching layer between the second and the third conductive layers. The switching layer contains: at least one first substance from a group consisting of oxide of at least one element from a group consisting of Cr, La, Ce, Y, Sc, Zr, and Hf, nitride of the at least one element, and oxynitride of the at least one element; a second substance being at least one metal from a group consisting of Te, Se, Sb, Bi, Ge, and Sn; and at least one third substance from a group consisting of oxide of the second substance, nitride of the second substance, and oxynitride of the second substance.

20 Claims, 21 Drawing Sheets

(56) References Cited

U.S. PATENT DOCUMENTS

2021/0104576 A1    4/2021  Lee
2022/0293176 A1    9/2022  Matsushita

FOREIGN PATENT DOCUMENTS

CN      115083465 A    9/2022
DE    102017000743 A1    7/2017

OTHER PUBLICATIONS

Brasted, Robert C.. "tellurium". Encyclopedia Britannica, Jun. 9, 2025, https://www.britannica.com/science/tellurium. Accessed Sep. 8, 2025. (Year: 2025).*

The Editors of Encyclopaedia Britannica. "antimony". Encyclopedia Britannica, Aug. 14, 2025, https://www.britannica.com/science/antimony. Accessed Sep. 8, 2025. (Year: 2025).*

The Editors of Encyclopaedia Britannica. "germanium". Encyclopedia Britannica, Aug. 5, 2025, https://www.britannica.com/science/germanium. Accessed Sep. 8, 2025. (Year: 2025).*

Shiro Kohara, "Composite interfaces and metal wettability", Bulletin of the Japan Institute of Metals, 1975, vol. 8, No. 14, pp. 584-585, partial translation provided, 10 pages.

Dean, "Lange's Handbook of Chemistry", McGraw-Hill, Inc., 1998, Fifteenth Edition, Tables 3.2 and 6.3, 7 pages.

* cited by examiner

MEMORY DEVICE

CROSS-REFERENCE TO RELATED APPLICATION

This application is based upon and claims the benefit of priority from Japanese Patent Application No. 2022-150282, filed on Sep. 21, 2022, the entire contents of which are incorporated herein by reference.

FIELD

Embodiments described herein relate generally to a memory device.

BACKGROUND

As a large-capacity nonvolatile memory device, there is a cross-point type two-terminal memory device. In the cross-point type two-terminal memory device, miniaturization and high integration of memory cells are easy.

Each memory cell of the cross-point type two-terminal memory device has, for example, a resistance change element and a switching element. Since the memory cell has a switching element, the current flowing through the memory cells other than the selected memory cell is suppressed.

The switching element is required to have excellent characteristics, such as low leakage current, high on-current, and high reliability.

DETAILED DESCRIPTION

Figure 1:
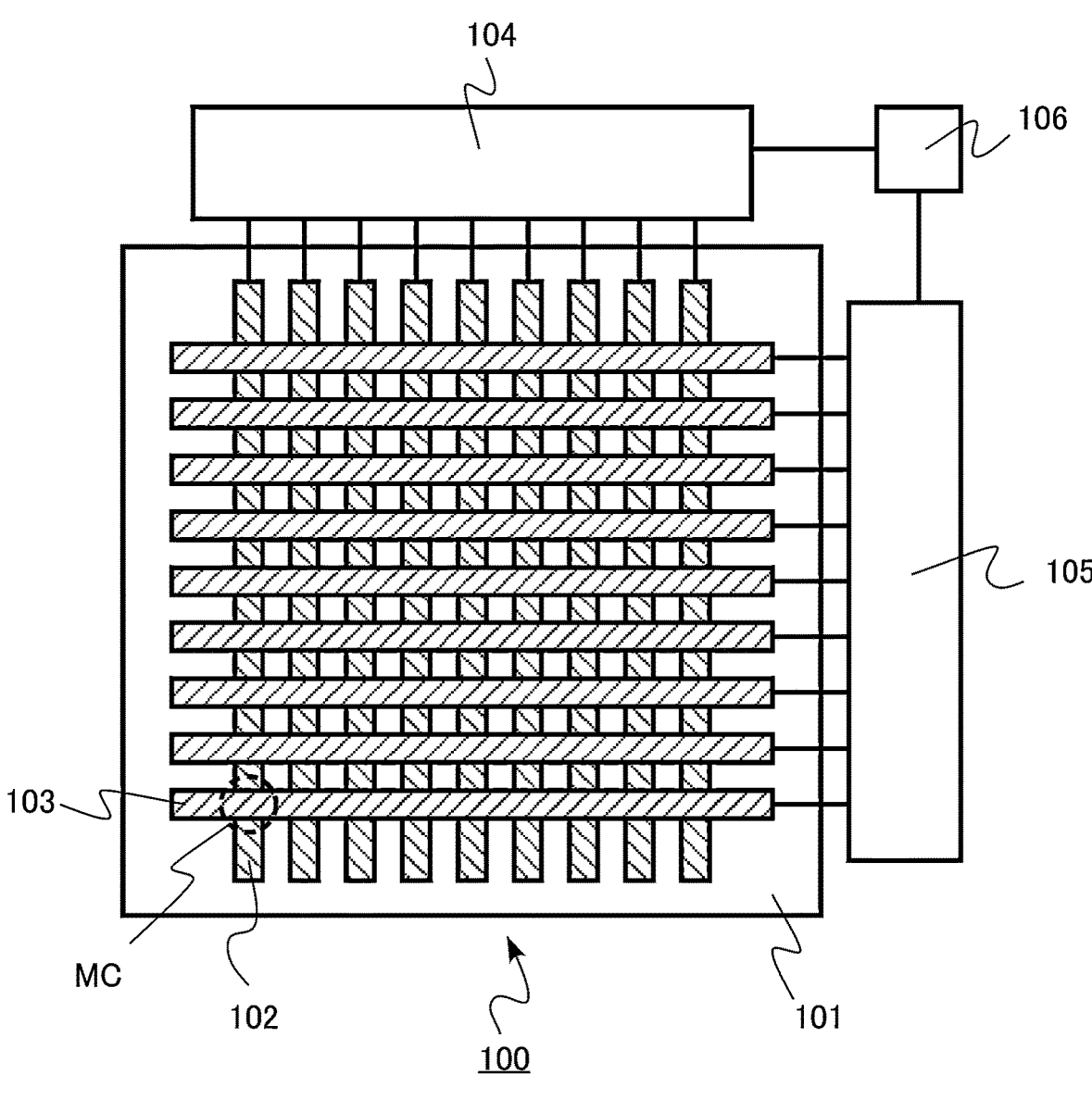
FIG. 1 is a block diagram of a memory device according to a first embodiment.

A memory device of embodiments includes: a first conductive layer; a second conductive layer; a third conductive layer; a resistance change layer provided between the first conductive layer and the second conductive layer; and a switching layer provided between the second conductive layer and the third conductive layer. The second conductive layer is provided between the first conductive layer and the third conductive layer. The switching layer contains: at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element; a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

Hereinafter, embodiments will be described with reference to the diagrams. In addition, in the following description, the same or similar members and the like are denoted by the same reference numerals, and the description of the members and the like once described will be omitted as appropriate.

The qualitative analysis and quantitative analysis of the chemical composition of members forming the memory device in this specification can be performed by, for example, secondary ion mass spectroscopy (SIMS), energy dispersive X-ray spectroscopy (EDX), and electron energy loss spectroscopy (EELS). In addition, when measuring the thickness of each member forming the memory device, a distance between members, and the like, for example, a transmission electron microscope (TEM) can be used. In addition, when identifying the constituent substances of each member forming the memory device and measuring the existence ratio of the constituent substances, for example, X-ray photoelectron spectroscopy (XPS) can be used.

First Embodiment

A memory device according to a first embodiment includes a first conductive layer, a second conductive layer, a third conductive layer, a resistance change layer provided between the first conductive layer and the second conductive layer, and a switching layer provided between the second conductive layer and the third conductive layer. The second conductive layer is provided between the first conductive layer and the third conductive layer. The switching layer contains: at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element; a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

In addition, the memory device according to the first embodiment includes: a plurality of first wirings; a plurality of second wirings crossing the plurality of first wirings; and a memory cell located in a region where each of the first wirings and each of the second wirings cross each other. The memory cell includes a first conductive layer, a second conductive layer, a third conductive layer, a resistance change layer provided between the first conductive layer and the second conductive layer, and a switching layer provided between the second conductive layer and the third conductive layer. The second conductive layer is provided between the first conductive layer and the third conductive layer. The switching layer contains: at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element; a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

FIG. 1 is a block diagram of the memory device according to the first embodiment.

A memory cell array 100 of the memory device according to the first embodiment includes, for example, a plurality of word lines 102 and a plurality of bit lines 103 crossing the word lines 102 on a semiconductor substrate 101 with an insulating layer interposed therebetween. The bit lines 103 are provided in a layer above the word lines 102, for example. In addition, a first control circuit 104, a second control circuit 105, and a sense circuit 106 are provided as peripheral circuits around the memory cell array 100.

The word line 102 is an example of the first wiring. In addition, the bit line 103 is an example of the second wiring.

A plurality of memory cells MC are provided in regions where the word lines 102 and the bit lines 103 cross each other. The memory device according to the first embodiment is a two-terminal magnetoresistive memory having a cross-point structure.

Each of the plurality of word lines 102 is connected to the first control circuit 104. In addition, each of the plurality of bit lines 103 is connected to the second control circuit 105. The sense circuit 106 is connected to the first control circuit 104 and the second control circuit 105.

The first control circuit 104 and the second control circuit 105 have functions of selecting a desired memory cell MC, writing data to the memory cell MC, reading data from the memory cell MC, and deleting data from the memory cell MC, for example. When reading data, the data in the memory cell MC is read as the amount of current flowing between the word line 102 and the bit line 103. The sense circuit 106 has a function of determining the amount of current to determine the polarity of the data. For example, "0" and "1" of data are determined.

The first control circuit 104, the second control circuit 105, and the sense circuit 106 are electronic circuits using semiconductor devices formed on the semiconductor substrate 101, for example.

Figure 2:
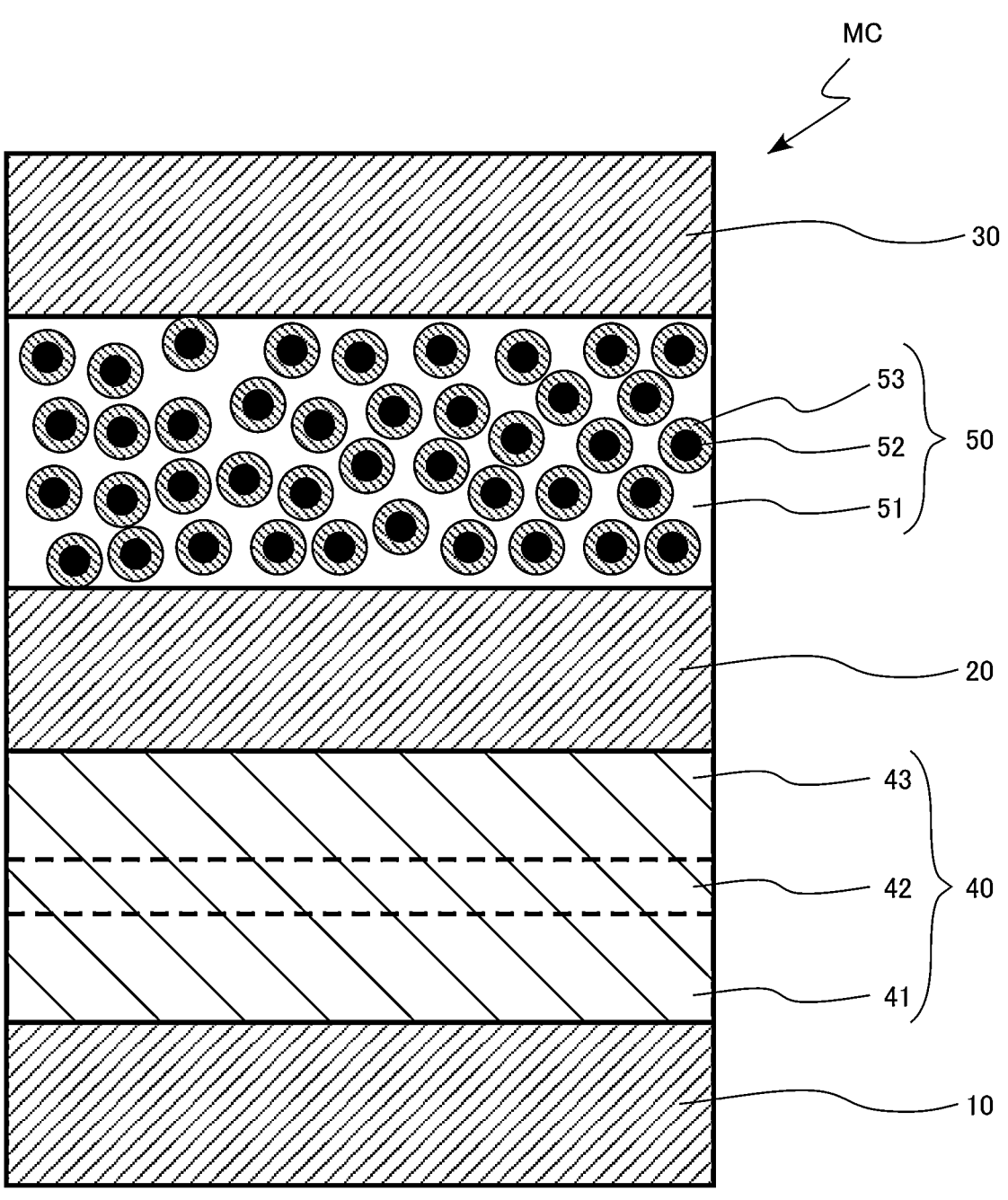
FIG. 2 is a schematic cross-sectional view of a memory cell in the memory device according to the first embodiment.

FIG. 2 is a schematic cross-sectional view of a memory cell in the memory device according to the first embodiment. FIG. 2 shows a cross section of one memory cell MC indicated by, for example, a dotted circle in the memory cell array 100 of FIG. 1.

As shown in FIG. 2, the memory cell MC includes a lower electrode 10, an intermediate electrode 20, an upper electrode 30, a resistance change layer 40, and a switching layer 50. The resistance change layer 40 includes a fixed layer 41, a tunnel layer 42, and a free layer 43. The switching layer 50 includes a matrix region 51, a metal region 52, and a metal insulator region 53.

The lower electrode 10 is an example of the first conductive layer. The intermediate electrode 20 is an example of the second conductive layer. The upper electrode 30 is an example of the third conductive layer.

The lower electrode 10, the resistance change layer 40, and the intermediate electrode 20 form a resistance change element of the memory cell MC. The intermediate electrode 20, the switching layer 50, and the upper electrode 30 form a switching element of the memory cell MC.

The lower electrode 10 is connected to the word line 102. The lower electrode 10 is, for example, a metal. The lower electrode 10 is, for example, titanium (Ti), tungsten (W), tantalum (Ta), platinum (Pt), or nitride thereof. The lower electrode 10 is, for example, titanium nitride. The lower electrode 10 may be a part of the word line 102.

The upper electrode 30 is connected to the bit line 103. The upper electrode 30 is, for example, a metal. The upper electrode 30 is, for example, titanium (Ti), tungsten (W), tantalum (Ta), platinum (Pt), or nitride thereof. The upper electrode 30 is, for example, titanium nitride. The upper electrode 30 may be a part of the bit line 103.

The upper electrode 30 contains, for example, carbon (C) or tungsten nitride. The upper electrode 30 is, for example, carbon (C) or tungsten nitride.

The intermediate electrode 20 is provided between the lower electrode 10 and the upper electrode 30. The intermediate electrode 20 is, for example, a metal. The intermediate electrode 20 is, for example, titanium (Ti), tungsten (W), tantalum (Ta), platinum (Pt), or nitride thereof. The intermediate electrode 20 is, for example, titanium nitride.

The intermediate electrode 20 contains, for example, carbon (C) or tungsten nitride. The intermediate electrode 20 is, for example, carbon (C) or tungsten nitride.

The resistance change layer 40 is provided between the lower electrode 10 and the intermediate electrode 20. The resistance change layer 40 includes the fixed layer 41, the tunnel layer 42, and the free layer 43. The resistance change layer 40 includes a magnetic tunnel junction formed by the fixed layer 41, the tunnel layer 42, and the free layer 43.

The resistance change layer 40 has a function of storing data by resistance change.

The fixed layer 41 is a ferromagnetic material. In the fixed layer 41, its magnetization direction is fixed in a specific direction.

The tunnel layer 42 is an insulator. Electrons pass through the tunnel layer 42 by the tunnel effect.

The free layer 43 is a ferromagnetic material. In the free layer 43, its magnetization direction changes. The magnetization direction of the free layer 43 can be a direction parallel to the magnetization direction of the fixed layer 41 or a direction opposite to the magnetization direction of the fixed layer 41. For example, by making a current flow between the lower electrode 10 and the intermediate electrode 20, the magnetization direction of the free layer 43 can be changed.

By changing the magnetization direction of the free layer 43, the resistance of the resistance change layer 40 changes. When the magnetization direction of the free layer 43 is antiparallel to the magnetization direction of the fixed layer 41, a current hardly flows to become a high resistance state. On the other hand, when the magnetization direction of the free layer 43 is parallel to the magnetization direction of the fixed layer 41, a current flows easily to become a low resistance state.

The switching layer 50 is provided between the intermediate electrode 20 and the upper electrode 30. The thickness of the switching layer 50 in the first direction from the lower electrode 10 to the upper electrode 30 is, for example, 2 nm or more and 10 nm or less.

The switching layer 50 has a nonlinear current-voltage characteristic in which a current increases abruptly at a specific voltage (threshold voltage). The switching layer 50 has a function of suppressing an increase in half-select leakage current flowing through the half-selected cell.

The switching layer 50 includes the matrix region 51, the metal region 52, and the metal insulator region 53.

FIG. 2 illustrates a form in which a plurality of metal regions 52 are dispersed in the matrix region 51 and the metal insulator region 53 is provided around each metal region 52. However, the form of the metal region 52 and the metal insulator region 53 is not necessarily limited to the form shown in FIG. 2.

The switching layer 50 contains at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element. The switching layer 50 contains a first substance containing at least one element selected from a group consisting of chromium (Cr), lanthanum (La), cerium (Ce), yttrium (Y), scandium (Sc), zirconium (Zr), and hafnium (Hf) and oxygen (O) or nitrogen (N). The switching layer 50 contains at least one element selected from a group consisting of chromium (Cr), lanthanum (La), cerium (Ce), yttrium (Y), scandium (Sc), zirconium (Zr), and hafnium (Hf) and oxygen (O) or nitrogen (N).

The first substance is contained, for example, in the matrix region 51. The first substance is, for example, a main component of the switching layer 50. "The first substance is the main component of the switching layer 50" means that the switching layer 50 does not contain a substance having a higher molar fraction than the first substance. In addition, the molar fraction is synonymous with the amount-of-substance fraction.

The molar fraction of the first substance contained in the switching layer 50 is, for example, 50 mol % or more and 90 mol % or less.

The first substance is an insulator. The first substance is, for example, chromium oxide, lanthanum oxide, cerium oxide, yttrium oxide, scandium oxide, zirconium oxide, or hafnium oxide.

The melting point of the first substance is, for example, 2000° C. or higher.

The switching layer 50 contains a second substance which is at least one metal selected from a group consisting of tellurium (Te), selenium (Se), antimony (Sb), bismuth (Bi), germanium (Ge), and tin (Sn). The second substance is a metal.

The second substance is contained, for example, in the metal region 52.

The molar fraction of the second substance contained in the switching layer 50 is, for example, 5 mol % or more and 40 mol % or less.

The second substance is a conductor. The second substance is, for example, tellurium, selenium, antimony, bismuth, germanium, or tin.

For example, the second substance contained in the switching layer 50 contains two or more kinds of metals selected from a group consisting of tellurium (Te), selenium (Se), antimony (Sb), bismuth (Bi), germanium (Ge), and tin (Sn). The second substance contained in the switching layer 50 is, for example, tellurium and selenium.

The switching layer 50 contains at least one third substance selected from a group consisting of oxide of the second substance contained in the switching layer 50, nitride of the second substance, and oxynitride of the second substance.

The third substance is contained, for example, in the metal insulator region 53.

The molar fraction of the third substance contained in the switching layer 50 is, for example, 5 mol % or more and 40 mol % or less.

The third substance is an insulator. The third substance is, for example, tellurium oxide, tellurium nitride, tellurium oxynitride, selenium oxide, selenium nitride, selenium oxynitride, antimony oxide, antimony nitride, antimony oxynitride, bismuth oxide, bismuth nitride, bismuth oxynitride, germanium oxide, germanium nitride, germanium oxynitride, tin oxide, tin nitride, or tin oxynitride.

The melting point of the first substance is higher than the melting point of the third substance.

In addition, the element contained in the first substance is an element that is more easily oxidized than the second substance. Therefore, the absolute value of the standard Gibbs energy of formation of the first substance is larger than the absolute value of the standard Gibbs energy of formation of the third substance.

The switching layer 50 can be formed by sputtering, for example. For example, the switching layer 50 can be formed by a co-sputtering method using a target containing the first substance and the third substance and a target containing the second substance.

Next, the function and effect of the memory device according to the first embodiment will be described.

In the memory device according to the first embodiment, the resistance of the resistance change layer 40 is changed by changing the magnetization direction of the free layer 43 as described above. When the magnetization direction of the free layer 43 is opposite to the magnetization direction of the fixed layer 41, a current hardly flows to become a high resistance state. On the other hand, when the magnetization direction of the free layer 43 is parallel to the magnetization direction of the fixed layer 41, a current flows easily to become a low resistance state.

For example, the high resistance state of the resistance change layer 40 is defined as data "1", and the low resistance state of the resistance change layer 40 is defined as data "0". Since the memory cell MC can maintain different resistance states, it is possible to store 1-bit data of "0" and "1". Writing to one memory cell is performed by making a current flow between a bit line and a word line connected to the cell.

Figure 3:
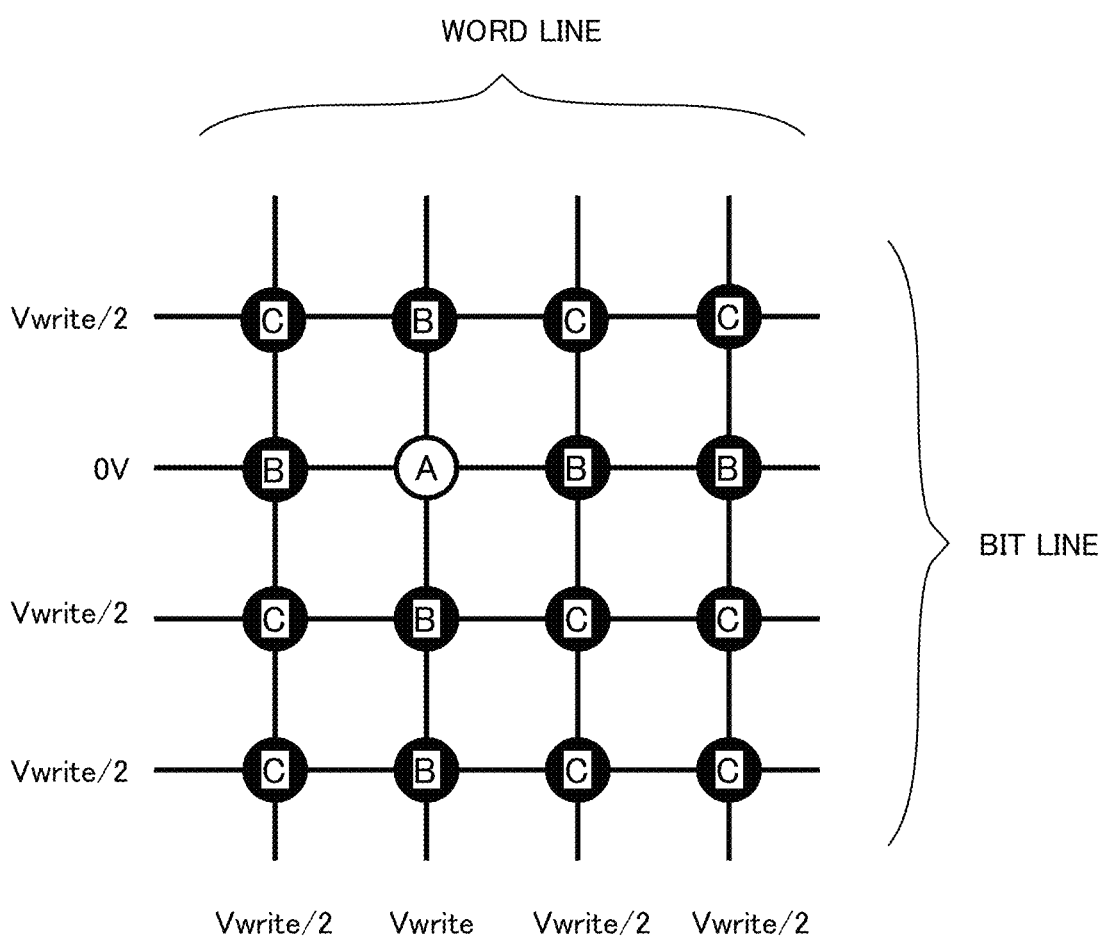
FIG. 3 is an explanatory diagram of a problem of the memory device according to the first embodiment.

FIG. 3 is an explanatory diagram of a problem of the memory device according to the first embodiment. FIG. 3 shows a voltage applied to the memory cell MC when one memory cell MC in the memory cell array is selected for write operation. The intersection of word lines and bit lines represents each memory cell MC.

The selected memory cell MC is a memory cell A (selected cell). A write voltage Vwrite is applied to the word line connected to the memory cell A. In addition, 0 V is applied to the bit line connected to the memory cell A.

Hereinafter, a case in which half (Vwrite/2) the write voltage is applied to the word lines and bit lines that are not connected to the memory cell A will be described as an example.

A voltage applied to memory cells C (non-selected cells) connected to the word lines and bit lines that are not connected to the memory cell A is 0 V. That is, no voltage is applied.

On the other hand, half (Vwrite/2) the write voltage Vwrite is applied to memory cells B (half-selected cells) connected to the word lines or bit lines connected to the memory cell A. Therefore, a half-select leakage current flows through the memory cell B (half-selected cell).

Figure 4:
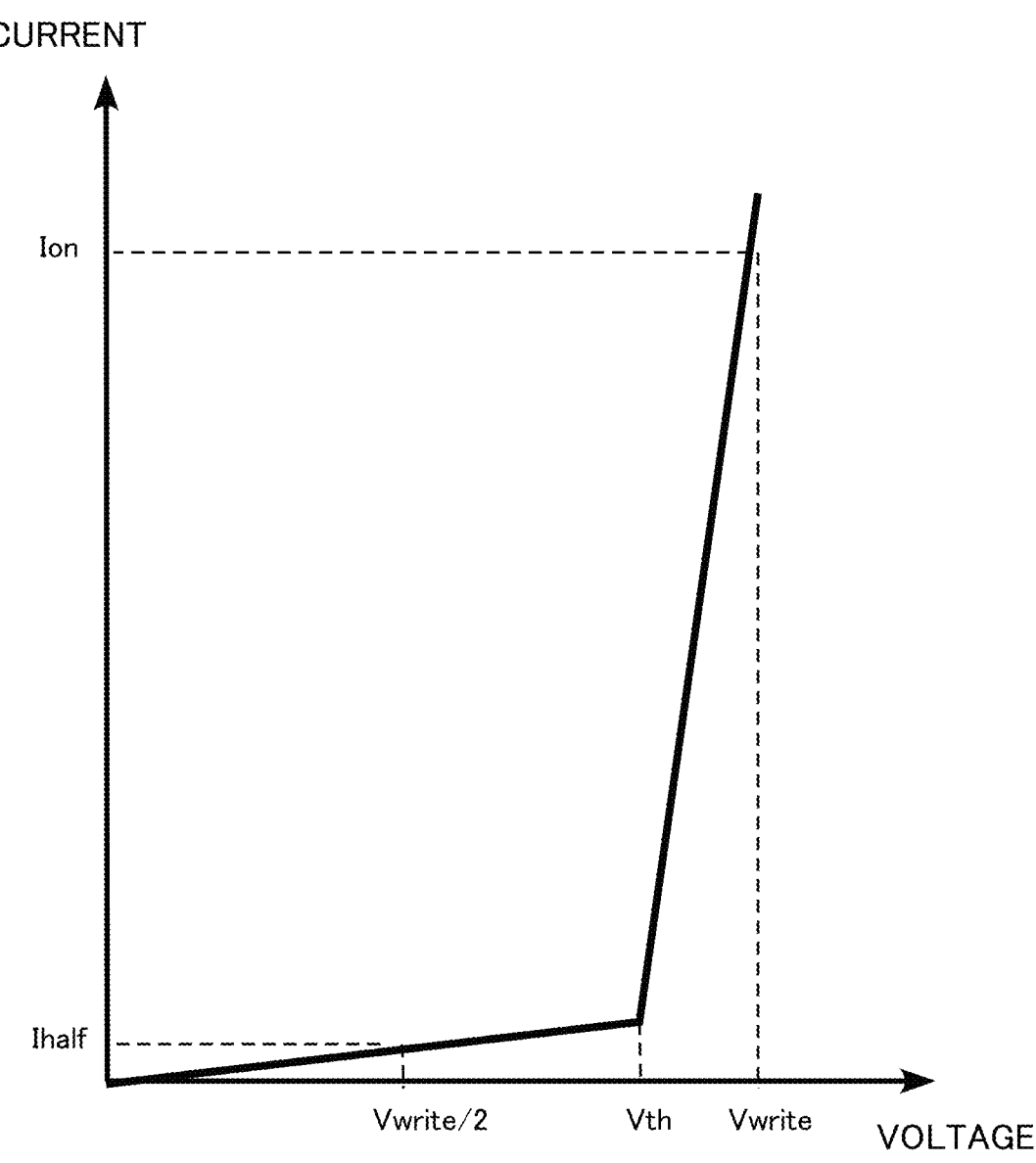
FIG. 4 is an explanatory diagram of the current-voltage characteristics of a switching element in the first embodiment.

FIG. 4 is an explanatory diagram of the current-voltage characteristics of a switching element in the first embodiment. The horizontal axis indicates a voltage applied to the switching element, and the vertical axis indicates a current flowing through the switching element.

The switching element has a nonlinear current-voltage characteristic in which a current increases abruptly at a threshold voltage Vth. The threshold voltage Vth is, for example, 0.5 V or more and 3 V or less.

The write voltage Vwrite is set such that the write voltage Vwrite is higher than the threshold voltage Vth and half (Vwrite/2) the write voltage Vwrite is lower than the threshold voltage Vth. The current flowing through the switching element when the write voltage Vwrite is applied is an on-current (Ion in FIG. 4). The current flowing through the switching element when half (Vwrite/2) the write voltage Vwrite is applied is a half-select leakage current (Ihalf in FIG. 4).

If the half-select leakage current is large, for example, the power consumption of the chip increases. In addition, for example, a voltage drop in the wiring increases and accordingly, a sufficiently high voltage is not applied to the selected cell. As a result, an operation for writing to the memory cell MC becomes unstable. In addition, if the on-current is small, for example, the current flowing through the selected cell is insufficient, resulting in insufficient writing to the memory cell MC. Therefore, as the current-voltage characteristics of the switching element, it is required to have both a low half-select leakage current and a high on-current.

The switching layer 50 of the switching element in the first embodiment contains the second substance. The second substance has a function of forming levels in the switching layer 50. When electrons flow through the switching layer 50, the electrons hop and move between the levels formed by the second substance. Since the second substance is contained, a current based on Poole-Frenkel conduction (PF conduction) can flow through the switching layer 50. By making a current based on Poole-Frenkel conduction (PF conduction) flow through the switching layer 50, it is possible to increase the on-current of the switching element in the first embodiment.

Figure 5:
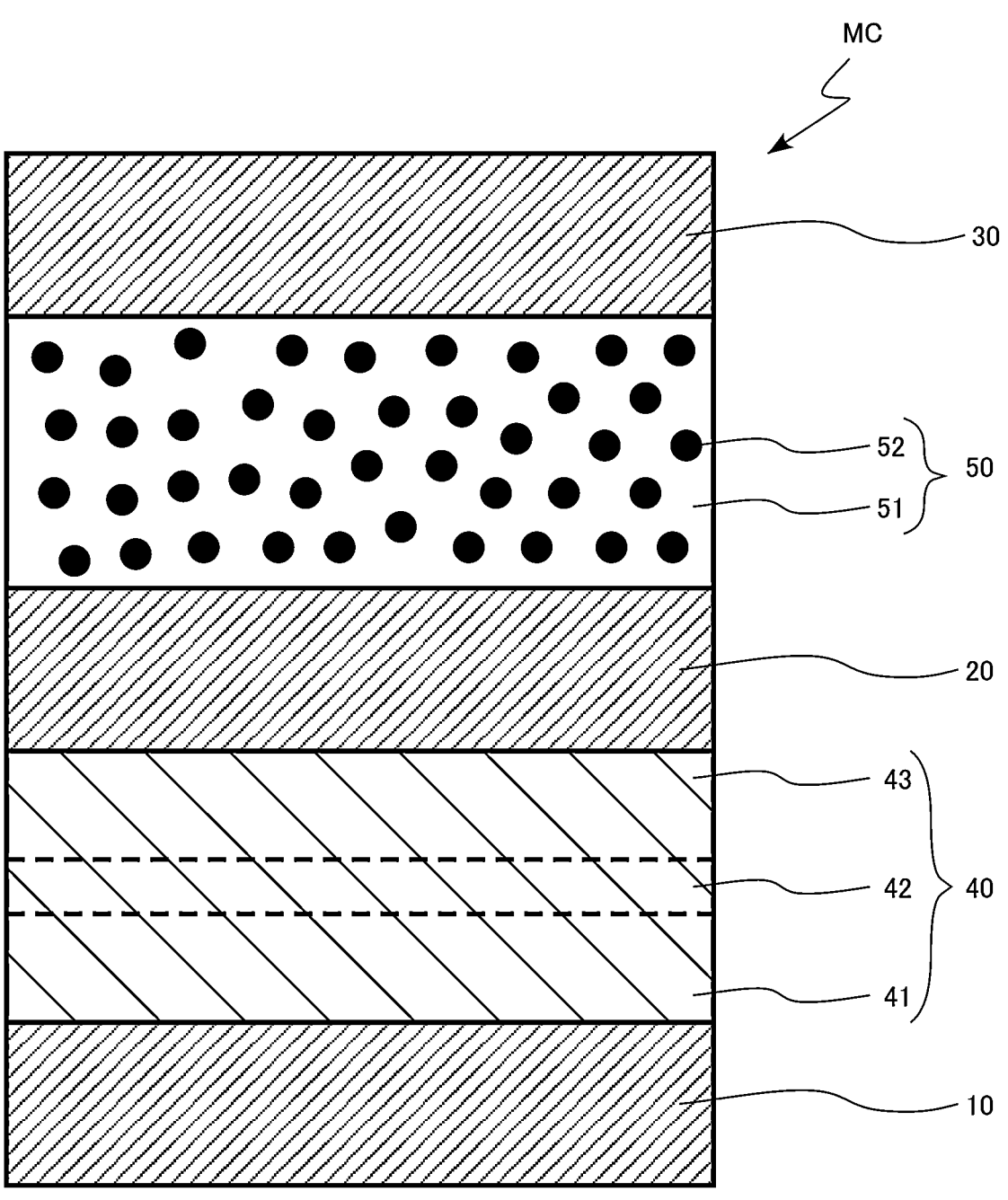
FIG. 5 is a schematic cross-sectional view of a memory cell of a memory device according to a comparative embodiment.

FIG. 5 is a schematic cross-sectional view of a memory cell of a memory device according to a comparative embodiment. FIG. 5 is a diagram corresponding to FIG. 2 of the first embodiment.

The memory cell MC of the memory device according to the comparative embodiment is different from the memory cell MC of the memory device according to the first embodiment in that the switching layer 50 does not contain at least one third substance selected from a group consisting of oxide of the second substance, nitride of the second substance, and oxynitride of the second substance. The memory cell MC of the memory device according to the comparative embodiment is different from the memory cell MC of the memory device according to the first embodiment in that the switching layer 50 does not contain the metal insulator region 53 as shown in FIG. 5, for example.

Figure 6:
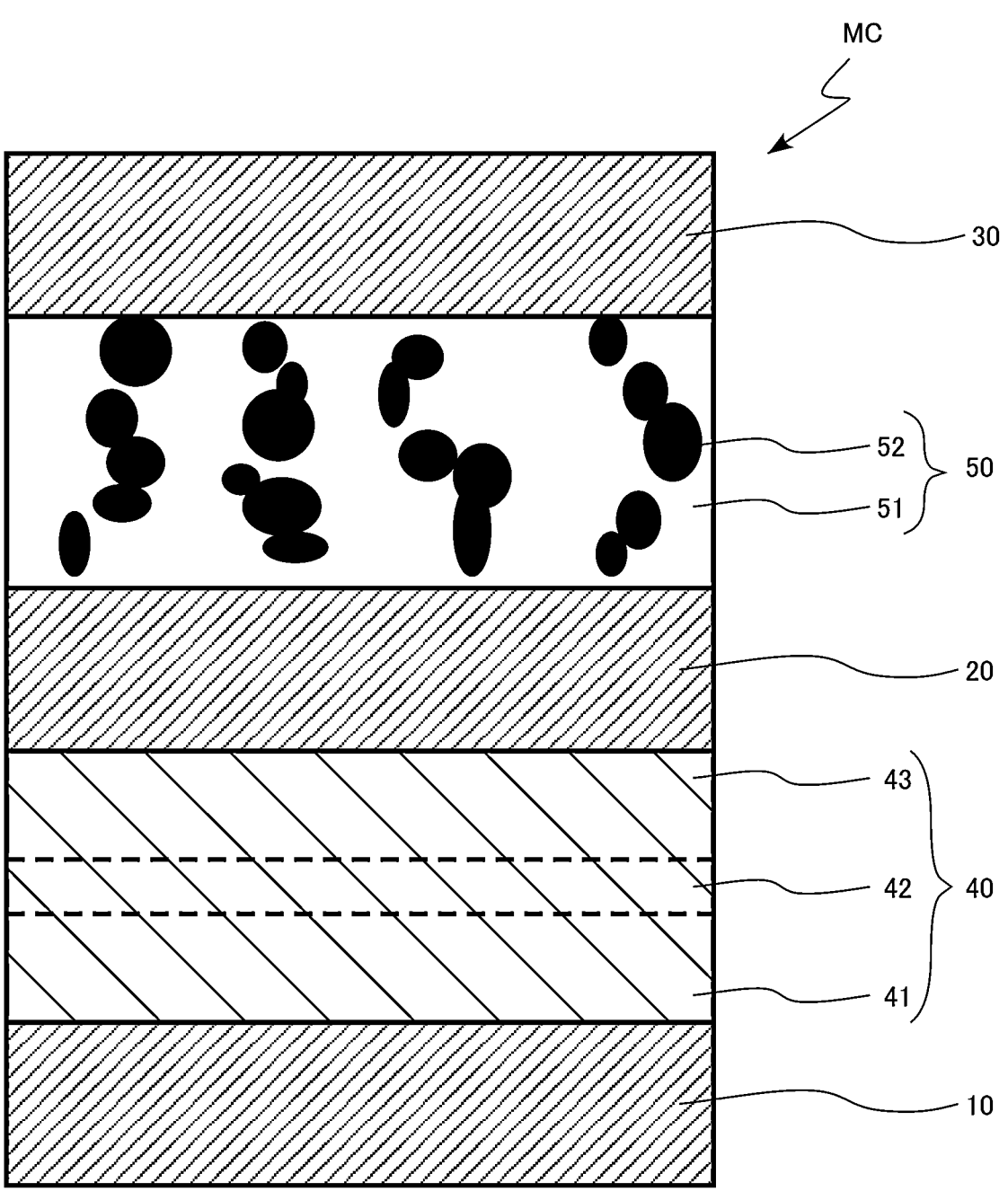
FIG. 6 is an explanatory diagram of a problem of the memory device according to the comparative embodiment.

FIG. 6 is an explanatory diagram of a problem of the memory device according to the comparative embodiment. FIG. 6 is a diagram corresponding to FIG. 5.

If a write operation on the memory cell MC of the memory device according to the comparative embodiment is repeated, the current-voltage characteristics of the switching element deteriorate. Specifically, repeating the write operation increases the half-select leakage current of the switching element.

FIG. 6 shows a state in which a write operation on the memory cell MC of the memory device according to the comparative embodiment shown in FIG. 5 is repeated. As shown in FIG. 6, the metal regions 52 agglomerate to form a current leakage path in the switching layer 50. It is believed that the formation of a current leakage path in the switching layer 50 increases the half-select leakage current of the switching element. In the memory device according to the comparative embodiment, the reliability of the switching element is reduced.

In the memory cell MC of the memory device according to the first embodiment, the switching layer 50 contains at least one third substance selected from a group consisting of oxide of the second substance, nitride of the second substance, and oxynitride of the second substance. Since the switching layer 50 contains the third substance, the current-voltage characteristics of the switching element do not deteriorate even when a write operation on the memory cell MC of the memory device according to the first embodiment is repeated. Agglomeration of the metal regions 52 is suppressed even when a write operation on the memory cell MC of the memory device according to the first embodiment is repeated.

It is believed that the reason why the agglomeration of the metal regions 52 is suppressed in the memory device according to the first embodiment is that the wettability between the metal region 52 and the matrix region 51 is improved due to the switching layer 50 containing at least one third substance selected from the group consisting of oxide of the second substance, nitride of the second substance, and oxynitride of the second substance.

In the memory device according to the first embodiment, since the agglomeration of the metal regions 52 is suppressed, an increase in half-select leakage current of the switching element is suppressed even after a write operation on the memory cell MC is repeated. Therefore, in the memory device according to the first embodiment, the reliability of the switching element is improved.

According to the first embodiment, it is possible to realize a switching element having a low half-select leakage current, a high on-current, and high reliability.

In the memory device according to the first embodiment, from the viewpoint of suppressing the agglomeration of the metal regions 52 and improving the reliability of the switching element, the molar fraction of the third substance contained in the switching layer 50 is preferably 5 mol % or more, more preferably 10 mol % or more, and even more preferably 20 mol % or more.

In the memory device according to the first embodiment, from the viewpoint of suppressing the agglomeration of the metal regions 52 and improving the reliability of the switching element, it is preferable that two or more kinds of metals are contained in the second substance in the switching layer 50.

In the memory device according to the first embodiment, from the viewpoint of increasing the on-current of the switching element, the molar fraction of the second substance contained in the switching layer 50 is preferably 5 mol % or more, more preferably 10 mol % or more, and even more preferably 20 mol % or more.

From the viewpoint of improving the reliability of the memory device according to the first embodiment, it is preferable that the intermediate electrode 20 contains carbon (C) or tungsten nitride. Since the intermediate electrode 20 contains carbon (C) or tungsten nitride, the occurrence of a situation is suppressed in which the second substance contained in the switching layer 50 diffuses into the intermediate electrode 20 to change the current-voltage characteristics of the switching element.

From the viewpoint of improving the reliability of the memory device according to the first embodiment, it is preferable that the upper electrode 30 contains carbon (C) or tungsten nitride. Since the upper electrode 30 contains carbon (C) or tungsten nitride, the occurrence of a situation is suppressed in which the second substance contained in the switching layer 50 diffuses into the upper electrode 30 to change the current-voltage characteristics of the switching element.

In the memory device according to the first embodiment, the melting point of the first substance contained in the switching layer 50 is higher than the melting point of the third substance. Since the melting point of the matrix region 51 containing the first substance is high, softening of the matrix region 51 is suppressed and agglomeration of the metal regions 52 is suppressed.

In the memory device according to the first embodiment, the first element contained in the first substance is an element that is more easily oxidized than the second substance. That is, the absolute value of the standard Gibbs energy of formation of the first substance is larger than the absolute value of the standard Gibbs energy of formation of the third substance. In other words, the second substance is more resistant to oxidation than the first element contained in the first substance. Therefore, for example, the oxidation of the second substance and the decrease in on-current are suppressed.

Modification Example

A memory device according to a further embodiment of the first embodiment further includes a first layer, which is provided between the second conductive layer and the switching layer and contains carbon or tungsten nitride, and a second layer, which is provided between the third conductive layer and the switching layer and contains carbon or tungsten nitride.

Figure 7:
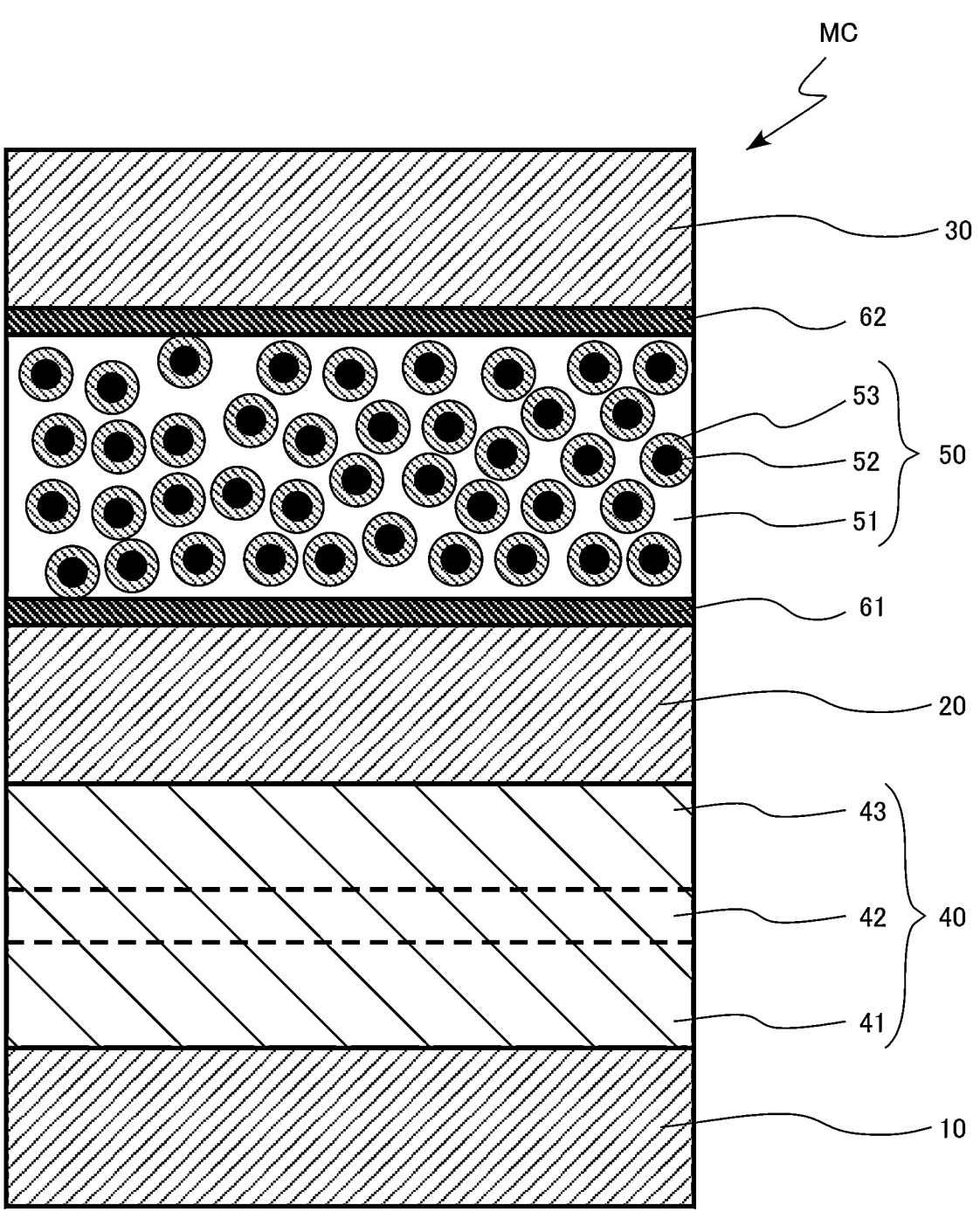
FIG. 7 is a schematic cross-sectional view of a memory cell in a memory device according to a further embodiment of the first embodiment.

FIG. 7 is a schematic cross-sectional view of a memory cell in a memory device according to a further embodiment of the first embodiment. FIG. 7 is a diagram corresponding to FIG. 2 of the first embodiment.

As shown in FIG. 7, the memory cell MC includes a lower electrode 10, an intermediate electrode 20, an upper electrode 30, a resistance change layer 40, a switching layer 50, a first barrier layer 61, and a second barrier layer 62. The resistance change layer 40 includes a fixed layer 41, a tunnel layer 42, and a free layer 43. The switching layer 50 includes a matrix region 51, a metal region 52, and a metal insulator region 53.

The first barrier layer 61 is an example of the first layer. The second barrier layer 62 is an example of the second layer.

The first barrier layer 61 is provided between the intermediate electrode 20 and the switching layer 50. The first barrier layer 61 contains carbon or tungsten nitride. The first barrier layer 61 is, for example, carbon or tungsten nitride. The chemical composition of the first barrier layer 61 is different from that of the intermediate electrode 20.

The second barrier layer 62 is provided between the upper electrode 30 and the switching layer 50. The second barrier layer 62 contains carbon or tungsten nitride. The second barrier layer 62 is, for example, carbon or tungsten nitride. The chemical composition of the second barrier layer 62 is different from that of the upper electrode 30.

The first barrier layer 61 suppresses the occurrence of a situation in which the second substance contained in the switching layer 50 diffuses into the intermediate electrode 20 to change the current-voltage characteristics of the switching element. In addition, the second barrier layer 62 suppresses the occurrence of a situation in which the second substance contained in the switching layer 50 diffuses into the upper electrode 30 to change the current-voltage characteristics of the switching element. Therefore, the reliability of the switching element is improved.

It is possible for the memory cell MC to have only one of the first barrier layer 61 and the second barrier layer 62.

As described above, according to the first embodiment and its further embodiment, it is possible to realize a switching element having a low half-select leakage current, a high on-current, and high reliability. Therefore, according to the first embodiment and its further embodiment, it is possible to realize a memory device having a switching element with excellent characteristics.

Second Embodiment

A memory device according to a second embodiment is different from the memory device according to the first embodiment in that the memory device according to the second embodiment is a resistive memory (ReRAM). Hereinafter, the description of a part of the content overlapping the first embodiment will be omitted.

Figure 8:
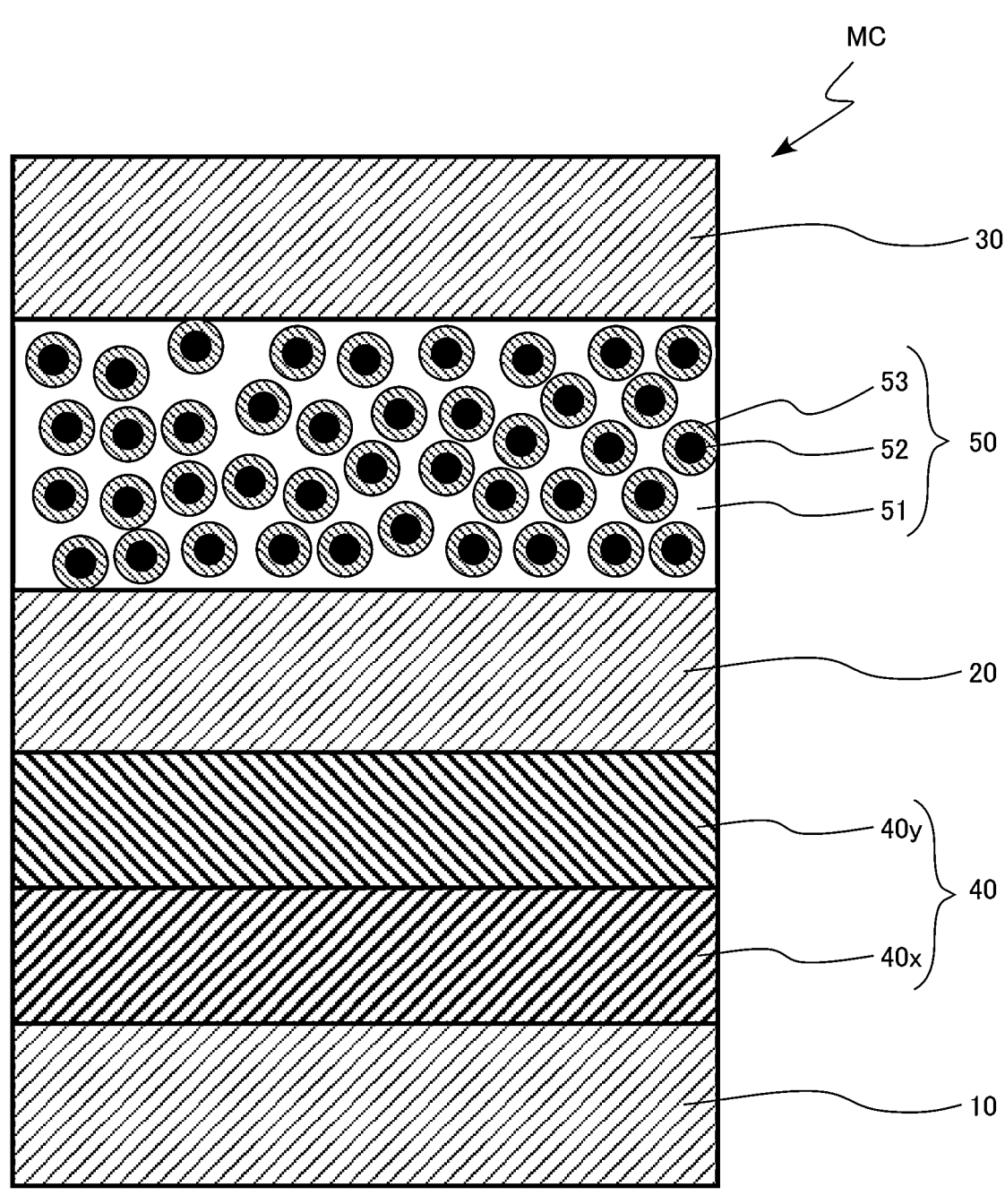
FIG. 8 is a schematic cross-sectional view of a memory cell in a memory device according to a second embodiment.

FIG. 8 is a schematic cross-sectional view of a memory cell in the memory device according to the second embodiment. FIG. 8 shows a cross section of one memory cell MC indicated by, for example, a dotted circle in the memory cell array 100 of FIG. 1.

As shown in FIG. 8, the memory cell MC includes a lower electrode 10, an intermediate electrode 20, an upper electrode 30, a resistance change layer 40, and a switching layer 50. The resistance change layer 40 includes a high resistance layer 40x and a low resistance layer 40y. The switching layer 50 includes a matrix region 51, a metal region 52, and a metal insulator region 53.

The lower electrode 10 is an example of the first conductive layer. The intermediate electrode 20 is an example of the second conductive layer. The upper electrode 30 is an example of the third conductive layer.

The lower electrode 10, the resistance change layer 40, and the intermediate electrode 20 form a resistance change element of the memory cell MC. The intermediate electrode 20, the switching layer 50, and the upper electrode 30 form a switching element of the memory cell MC.

The resistance change layer 40 includes the high resistance layer 40x and the low resistance layer 40y.

The high resistance layer 40x is, for example, metal oxide. The high resistance layer 40x is, for example, aluminum oxide, hafnium oxide, zirconium oxide, tantalum oxide, or niobium oxide.

The low resistance layer 40y is, for example, metal oxide. The low resistance layer 40y is, for example, titanium oxide, niobium oxide, tantalum oxide, or tungsten oxide.

By applying a current to the resistance change layer 40, the resistance change layer 40 changes from a high resistance state to a low resistance state or from a low resistance state to a high resistance state. By applying a current to the resistance change layer 40, oxygen ions move between the high resistance layer 40x and the low resistance layer 40y, so that the amount of oxygen deficiency (the amount of oxygen vacancies) in the low resistance layer 40y changes. The electrical conductivity of the resistance change layer 40 changes according to the amount of oxygen deficiency in the low resistance layer 40y. The low resistance layer 40y is a so-called vacancy modulated conductive oxide.

For example, the high resistance state is defined as data "1", and the low resistance state is defined as data "0". The memory cell can store 1-bit data of "0" and "1".

The configuration of the switching layer 50 is similar to that in the memory device according to the first embodiment.

As described above, according to the memory device according to the second embodiment, as in the first embodiment, it is possible to realize a switching element having a low half-select leakage current, a high on-current, and high reliability. Therefore, according to the second embodiment, it is possible to realize a memory device having a switching element with excellent characteristics.

Third Embodiment

A memory device according to a third embodiment includes a memory cell including a first conductive layer, a second conductive layer, and a memory layer provided between the first conductive layer and the second conductive layer. The memory layer contains: at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element; a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

In addition, the memory device according to the third embodiment further includes a plurality of first wirings and a plurality of second wirings crossing the plurality of first wirings. In addition, the memory cell is provided in a region where one of the plurality of first wirings and one of the plurality of second wirings cross each other.

The memory device according to the third embodiment is different from the memory devices according to the first and second embodiments in that the memory cell does not include a resistance change layer and includes the same configuration as the switching layer in the first and second embodiments as a memory layer. Hereinafter, the description of a part of the content overlapping the first or second embodiment will be omitted.

Figure 9:
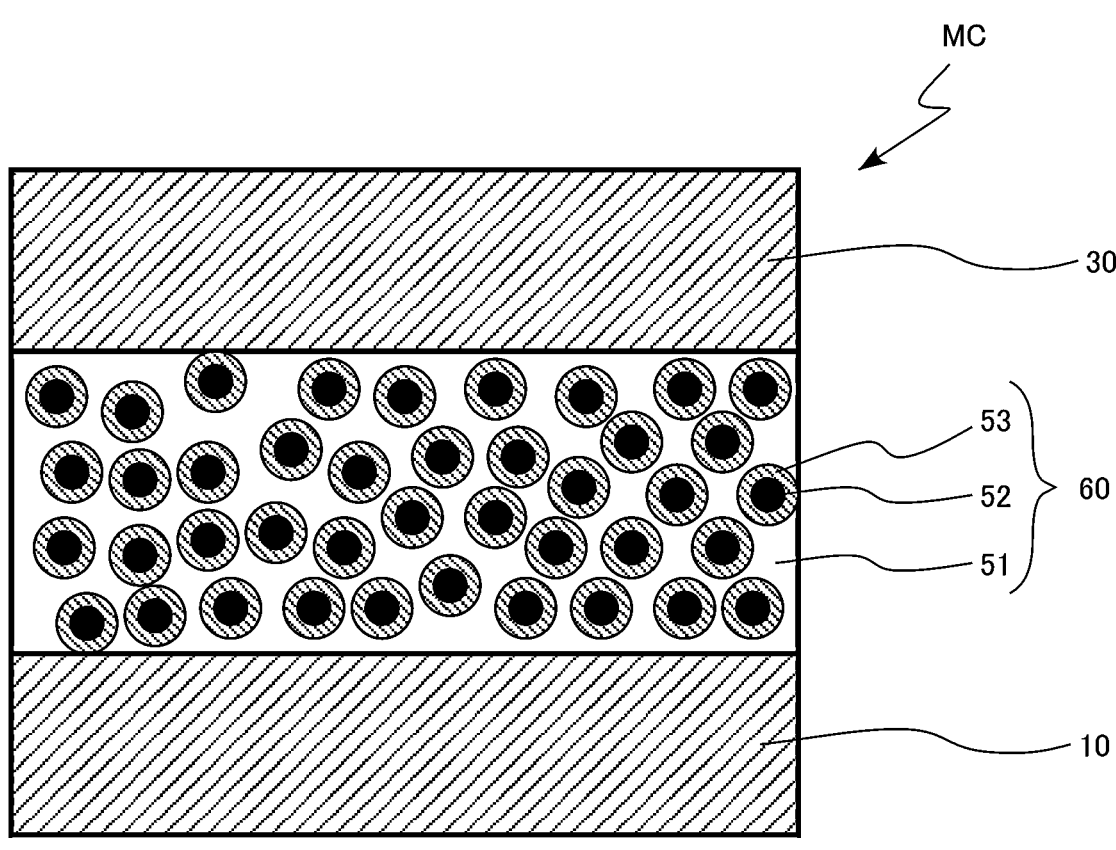
FIG. 9 is a schematic cross-sectional view of a memory cell in a memory device according to a third embodiment.

FIG. 9 is a schematic cross-sectional view of a memory cell in the memory device according to the third embodiment. FIG. 9 shows a cross section of one memory cell MC indicated by, for example, a dotted circle in the memory cell array 100 of FIG. 1.

As shown in FIG. 9, the memory cell MC includes a lower electrode 10, an upper electrode 30, and a memory layer 60.

The lower electrode 10 is an example of the first conductive layer. The upper electrode 30 is an example of the second conductive layer.

The lower electrode 10, the memory layer 60, and the upper electrode 30 form a memory element of the memory cell MC. The memory element of the memory cell MC has a switching function and an information storage function.

The memory layer 60 has a configuration similar to that of the switching layer 50 in the first and second embodiments. That is, the memory layer 60 contains: at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element; a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

The memory layer 60 has a nonlinear current-voltage characteristic in which a current increases abruptly at a specific threshold voltage. In addition, the memory layer 60 has a characteristic that the threshold voltage changes with the application of a predetermined voltage. The memory layer 60 has a characteristic that the electrical resistance changes with the application of a predetermined voltage. In the third embodiment, the high resistance state is a state in which the resistance of the memory layer 60 is relatively high at the read voltage. In addition, in the third embodiment, the low resistance state is a state in which the resistance of the memory layer 60 is relatively low at the read voltage.

The memory layer 60 has a function of suppressing an increase in half-select leakage current flowing through the half-selected cell. In addition, the memory layer 60 has a function of storing data by resistance change. The memory layer 60 is a single layer and realizes the function of the switching layer 50 and the function of the resistance change layer 40 in the first and second embodiments.

Figure 10:
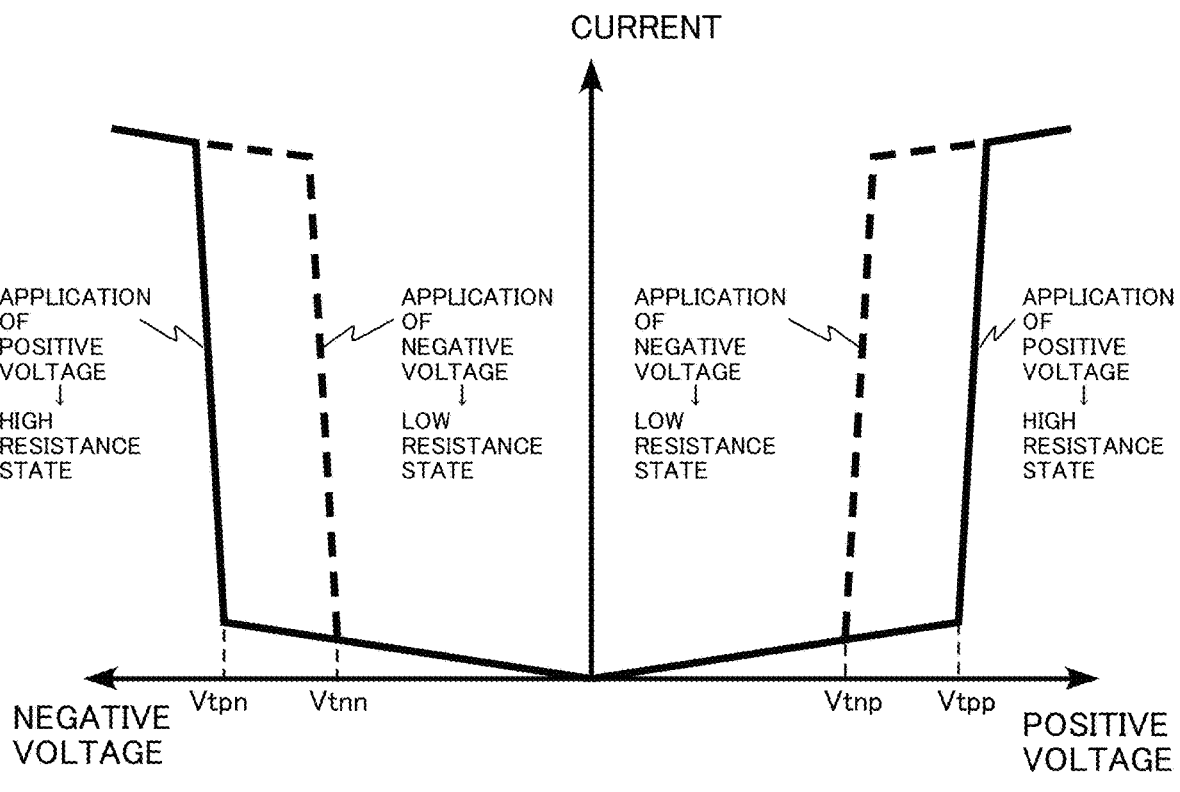
FIG. 10 is an explanatory diagram of the current-voltage characteristics of a memory element according to the third embodiment.

FIG. 10 is an explanatory diagram of the current-voltage characteristics of a memory element according to the third embodiment. The horizontal axis indicates a voltage applied to the memory element, and the vertical axis indicates a current flowing through the memory element. In FIG. 10, the horizontal axis indicates a voltage applied to the upper electrode 30 with the potential of the lower electrode 10 as a reference. FIG. 10 shows the current-voltage characteristics of the memory layer 60 in the third embodiment. FIG. 10 shows the current-voltage characteristics of the memory cell MC in the third embodiment.

The memory element according to the third embodiment shows different current-voltage characteristics when a predetermined positive voltage is applied to the upper electrode 30 and when a predetermined negative voltage is applied to the upper electrode 30. In FIG. 10, the solid line indicates the current-voltage characteristics when a predetermined positive voltage is applied to the upper electrode 30, and the dotted line indicates the current-voltage characteristics when a predetermined negative voltage is applied to the upper electrode 30.

When a predetermined positive voltage is applied to the upper electrode 30, the current increases abruptly at a first positive voltage side threshold voltage Vtpp on the positive voltage side. In addition, when a predetermined positive voltage is applied to the upper electrode 30, the current increases abruptly at a first negative voltage side threshold voltage Vtpn on the negative voltage side.

On the other hand, when a predetermined negative voltage is applied to the upper electrode 30, the current increases abruptly at a second positive voltage side threshold voltage Vtnp on the positive voltage side. In addition, when a predetermined negative voltage is applied to the upper electrode 30, the current increases abruptly at a second negative voltage side threshold voltage Vtnn on the negative voltage side.

The first positive voltage side threshold voltage Vtpp is higher than the second positive voltage side threshold voltage Vtnp. In addition, the first negative voltage side threshold voltage Vtpn is lower than the second negative voltage side threshold voltage Vtnn.

The memory element according to the third embodiment can have a high resistance state and a low resistance state on both the positive voltage side and the negative voltage side. When a predetermined positive voltage is applied to the upper electrode 30, a high resistance state is realized on both the positive voltage side and the negative voltage side. On the other hand, when a predetermined negative voltage is applied to the upper electrode 30, a low resistance state occurs on both the positive voltage side and the negative voltage side. Hereinafter, the high resistance state will be defined as data "1", and the low resistance state will be defined as data "0". The memory cell MC can store 1-bit data of "0" and "1".

Figure 11:
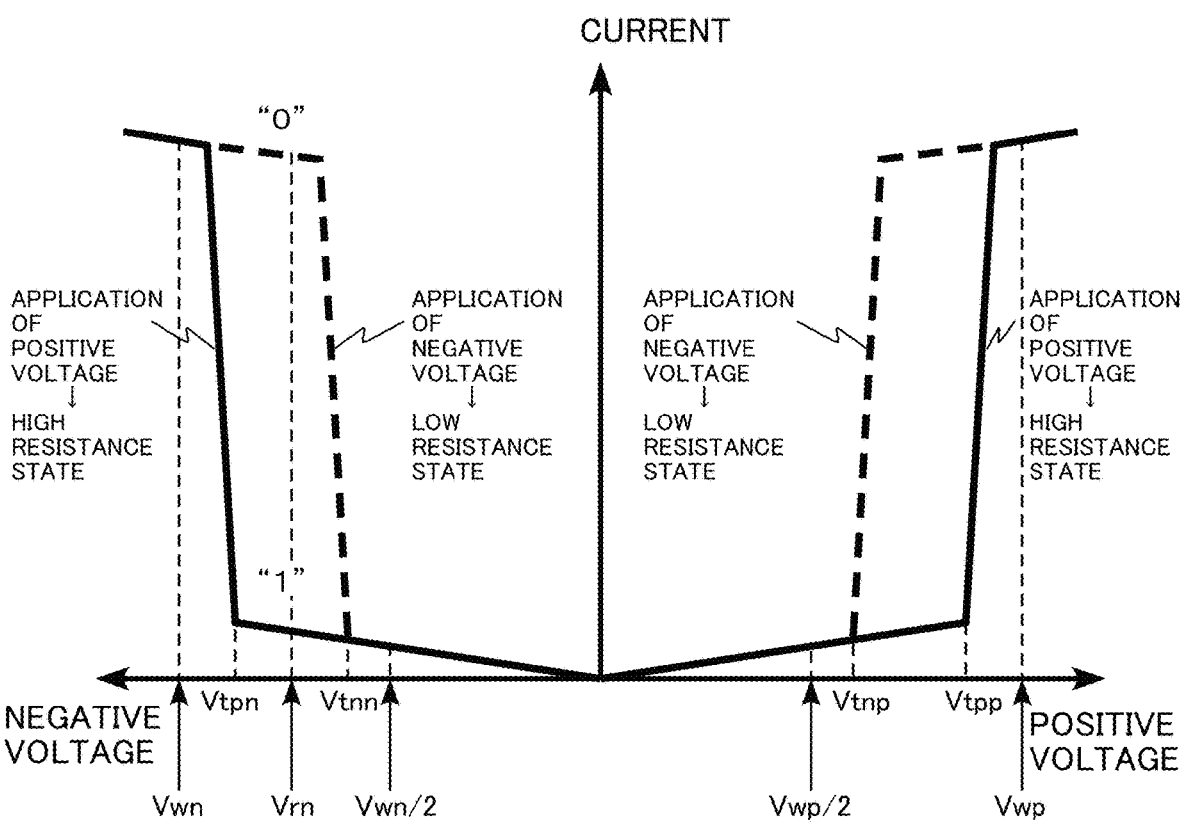
FIG. 11 is an explanatory diagram of a first operation embodiment of a memory operation in the memory device according to the third embodiment.

FIG. 11 is an explanatory diagram of a first operation embodiment of a memory operation in the memory device according to the third embodiment. FIG. 11 shows a positive side write voltage Vwp, half (Vwp/2) the positive side write voltage Vwp, a negative side write voltage Vwn, half (Vwn/2) the negative side write voltage Vwn, and a negative side read voltage Vrn when performing a memory operation.

In the first operation embodiment, the high resistance state and the low resistance state on the negative voltage side are used for the memory operation. In the first operation embodiment, the negative side read voltage Vrn is used as a read voltage.

When writing data "1" to the selected cell, the positive side write voltage Vwp is applied to the upper electrode 30. The positive side write voltage Vwp is a voltage higher than the first positive voltage side threshold voltage Vtpp. By applying the positive side write voltage Vwp to the upper electrode 30, a high resistance state is realized on the negative voltage side, and data "1" is written to the selected cell.

When writing data "0" to the selected cell, the negative side write voltage Vwn is applied to the upper electrode 30. The negative side write voltage Vwn is a voltage lower than the first negative voltage side threshold voltage Vtpn. By applying the negative side write voltage Vwn to the upper electrode 30, a low resistance state is realized on the negative voltage side, and data "0" is written to the selected cell.

In the first operation embodiment, when writing data "1" to the selected cell, if the data stored in the selected cell is data "0", a current flows if the positive side write voltage Vwp is higher than the second positive voltage side threshold voltage Vtnp even if the positive side write voltage Vwp is lower than the first positive voltage side threshold voltage Vtpp. For this reason, data "1" may be written. Therefore, for example, by setting the positive side write voltage Vwp to a voltage between the second positive voltage side threshold voltage Vtnp and the first positive voltage side threshold voltage Vtpp, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the second positive voltage side threshold voltage Vtnp. In addition, the voltage Vwn/2 is higher than the second negative voltage side threshold voltage Vtnn.

Therefore, even when the half-selected cell is in the low resistance state, the half-select leakage current flowing through the half-selected cell can be suppressed. As a result, the memory element also functions as a switching element.

When reading data from the selected cell, the negative side read voltage Vrn is applied to the selected cell. The data of the selected cell can be determined by detecting a current change or a potential change caused by the difference between a current that flows when data is "1" and a current that flows when data is "0".

In addition, in the case of the first operation embodiment, regardless of whether the data of the selected cell is data "1" or data "0", the application of the negative side read voltage Vrn does not destroy the data. In other words, in the case of the first operation embodiment, non-destructive reading is possible regardless of whether the data of the selected cell is data "1" or data "0".

Figure 12:
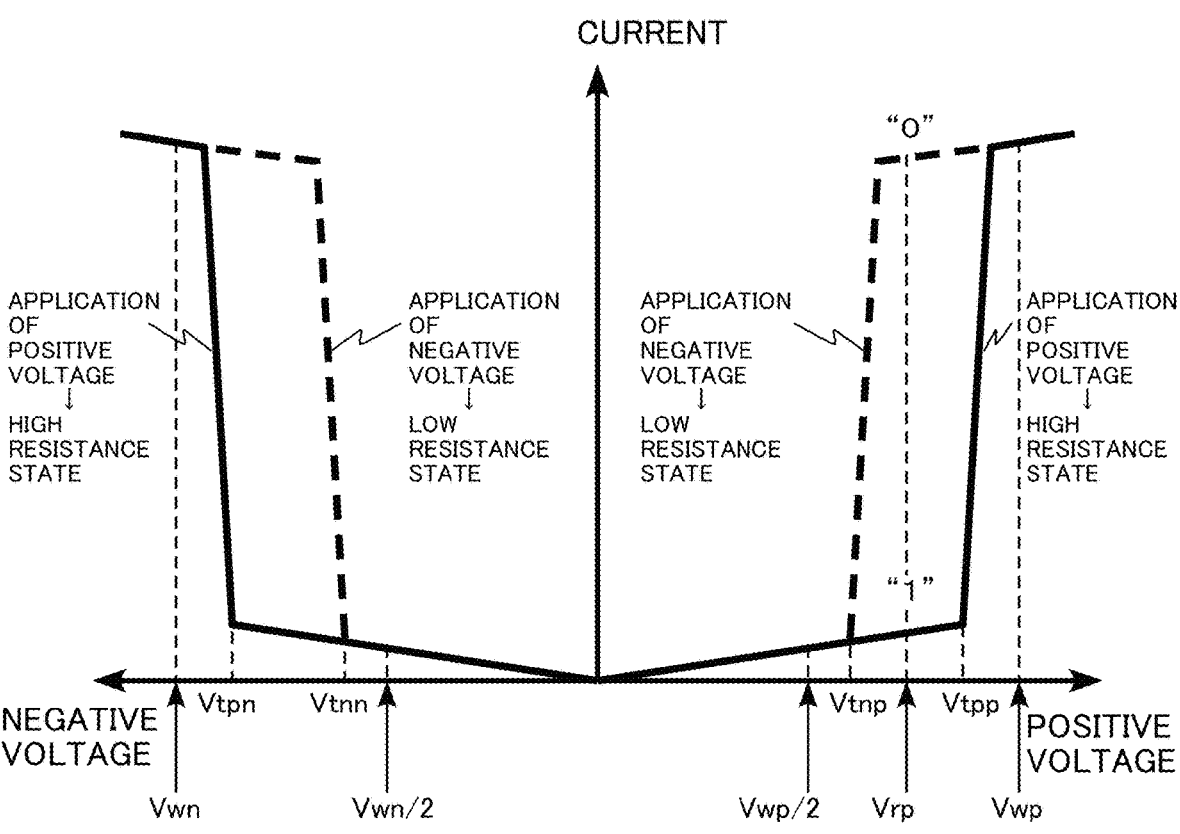
FIG. 12 is an explanatory diagram of a second operation embodiment of the memory operation in the memory device according to the third embodiment.

FIG. 12 is an explanatory diagram of a second operation embodiment of the memory operation in the memory device according to the third embodiment. FIG. 12 shows a positive side write voltage Vwp, half (Vwp/2) the positive side write voltage Vwp, a negative side write voltage Vwn, half (Vwn/2) the negative side write voltage Vwn, and a positive side read voltage Vrp when performing a memory operation.

In the second operation embodiment, the high resistance state and the low resistance state on the positive voltage side are used for the memory operation. In the second operation embodiment, the positive side read voltage Vrp is used as a read voltage.

When writing data "1" to the selected cell, the positive side write voltage Vwp is applied to the upper electrode 30. The positive side write voltage Vwp is a voltage higher than the first positive voltage side threshold voltage Vtpp. By applying the positive side write voltage Vwp to the upper electrode 30, a high resistance state is realized on the positive voltage side, and data "1" is written to the selected cell.

When writing data "0" to the selected cell, the negative side write voltage Vwn is applied to the upper electrode 30. The negative side write voltage Vwn is a voltage lower than the first negative voltage side threshold voltage Vtpn. By applying the negative side write voltage Vwn to the upper electrode 30, a low resistance state is realized on the positive voltage side, and data "0" is written to the selected cell.

In the second operation embodiment, when writing data "1" to the selected cell, if the data stored in the selected cell is data "0", a current flows if the positive side write voltage Vwp is higher than the second positive voltage side threshold voltage Vtnp even if the positive side write voltage Vwp is lower than the first positive voltage side threshold voltage Vtpp. For this reason, data "1" may be written. Therefore, for example, by setting the positive side write voltage Vwp to a voltage between the second positive voltage side threshold voltage Vtnp and the first positive voltage side threshold voltage Vtpp, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the second positive voltage side threshold voltage Vtnp. In addition, the voltage Vwn/2 is higher than the second negative voltage side threshold voltage Vtnn.

Therefore, even when the half-selected cell is in the low resistance state, the half-select leakage current flowing through the half-selected cell can be suppressed. As a result, the memory element also functions as a switching element.

When reading data from the selected cell, the positive side read voltage Vrp is applied to the selected cell. The data of the selected cell can be determined by detecting a current change or a potential change caused by the difference between a current that flows when data is "1" and a current that flows when data is "0".

In addition, in the case of the second operation embodiment, when the data of the selected cell is data "1", the application of the positive side read voltage Vrp does not destroy the data. In other words, in the case of the second operation embodiment, non-destructive reading is possible if the data of the selected cell is data "1". On the other hand, when the data of the selected cell is data "0", the application of the positive side read voltage Vrp higher than the second positive voltage side threshold voltage Vtnp may cause a current to flow. As a result, the data of the selected cell may change to data "1". In other words, in the case of the second operation embodiment, when the data of the selected cell is data "0", there is a possibility of destructive reading. Therefore, when the data of the selected cell is data "0", it may be necessary to rewrite the data "0" in order to maintain the data of the selected cell after reading the data of the selected cell.

First Modification Example

A memory device according to a first further embodiment of the third embodiment is different from the memory device according to the third embodiment in that the current-voltage characteristics of the memory elements are different.

Figure 13:
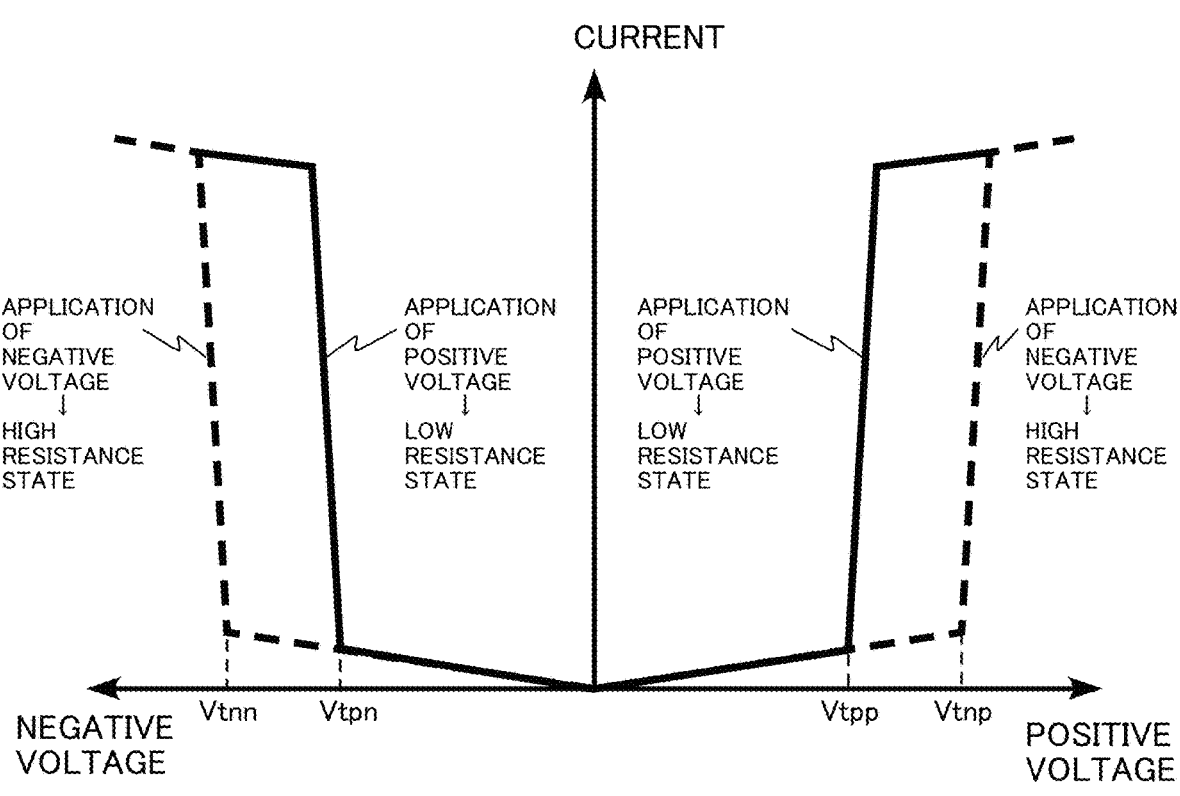
FIG. 13 is an explanatory diagram of the current-voltage characteristics of a memory element according to a first further embodiment of the third embodiment.

FIG. 13 is an explanatory diagram of the current-voltage characteristics of a memory element according to the first further embodiment of the third embodiment. The horizontal axis indicates a voltage applied to the memory element, and the vertical axis indicates a current flowing through the memory element. In FIG. 13, the horizontal axis indicates a voltage applied to the upper electrode 30 with the potential of the lower electrode 10 as a reference. FIG. 13 shows the current-voltage characteristics of the memory layer 60 in the first further embodiment of the third embodiment. FIG. 13 shows the current-voltage characteristics of the memory cell MC in the first further embodiment of the third embodiment.

The memory element according to the first further embodiment of the third embodiment shows different current-voltage characteristics when a predetermined positive voltage is applied to the upper electrode 30 and when a predetermined negative voltage is applied to the upper electrode 30. In FIG. 13, the solid line indicates the current-voltage characteristics when a predetermined positive voltage is applied to the upper electrode 30, and the dotted line indicates the current-voltage characteristics when a predetermined negative voltage is applied to the upper electrode 30.

When a predetermined positive voltage is applied to the upper electrode 30, the current increases abruptly at the first positive voltage side threshold voltage Vtpp on the positive voltage side. In addition, when a predetermined positive voltage is applied to the upper electrode 30, the current increases abruptly at the first negative voltage side threshold voltage Vtpn on the negative voltage side.

On the other hand, when a predetermined negative voltage is applied to the upper electrode 30, the current increases abruptly at the second positive voltage side threshold voltage Vtnp on the positive voltage side. In addition, when a predetermined negative voltage is applied to the upper electrode 30, the current increases abruptly at the second negative voltage side threshold voltage Vtnn on the negative voltage side.

The first positive voltage side threshold voltage Vtpp is lower than the second positive voltage side threshold voltage Vtnp. In addition, the first negative voltage side threshold voltage Vtpn is higher than the second negative voltage side threshold voltage Vtnn.

The memory element according to the first further embodiment of the third embodiment can have a high resistance state and a low resistance state on both the positive voltage side and the negative voltage side. When a predetermined positive voltage is applied to the upper electrode 30, a low resistance state is realized on both the positive voltage side and the negative voltage side. On the other hand, when a predetermined negative voltage is applied to the upper electrode 30, a high resistance state occurs on both the positive voltage side and the negative voltage side. Hereinafter, the high resistance state will be defined as data "1", and the low resistance state will be defined as data "0". The memory cell MC can store 1-bit data of "0" and "1".

Figure 14:
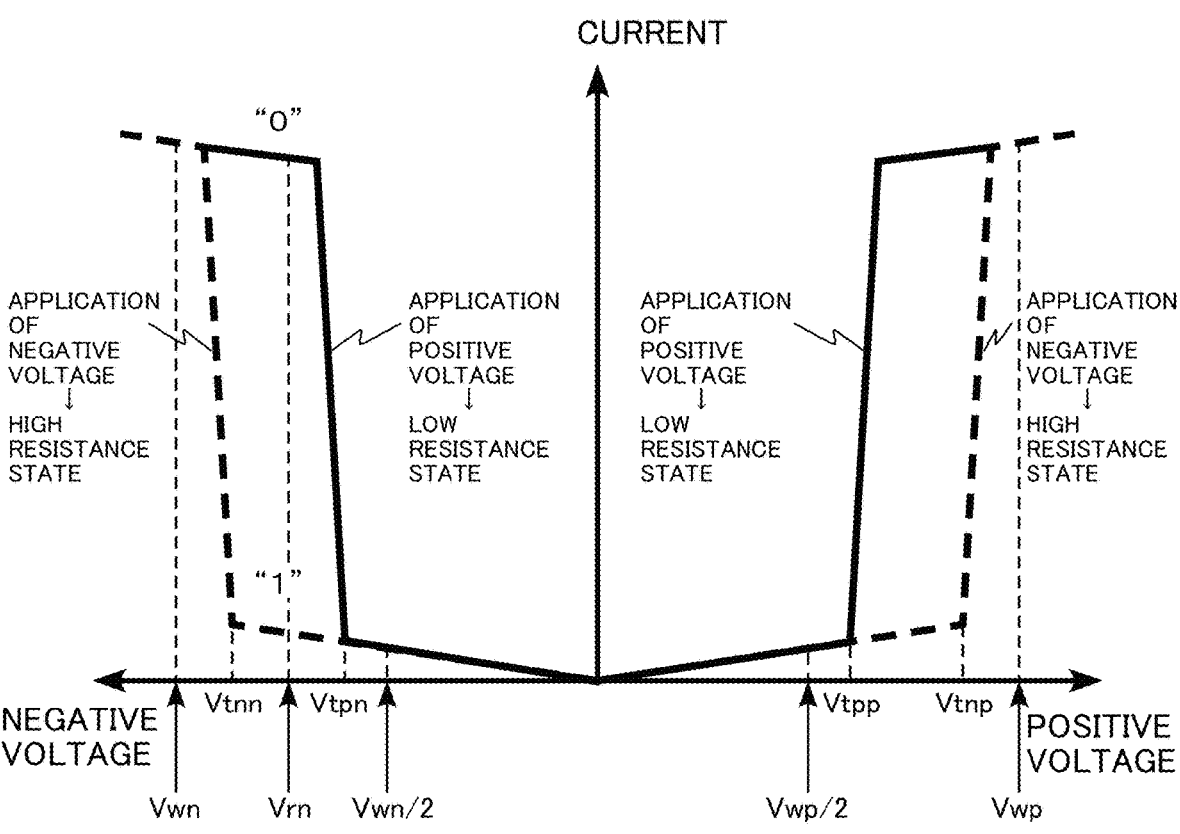
FIG. 14 is an explanatory diagram of a third operation embodiment of a memory operation in a memory device according to the first further embodiment of the third embodiment.

FIG. 14 is an explanatory diagram of a third operation embodiment of the memory operation in the memory device according to the first further embodiment of the third embodiment. FIG. 14 shows a positive side write voltage Vwp, half (Vwp/2) the positive side write voltage Vwp, a negative side write voltage Vwn, half (Vwn/2) the negative side write voltage Vwn, and a negative side read voltage Vrn when performing a memory operation.

In the third operation embodiment, the high resistance state and the low resistance state on the negative voltage side are used for the memory operation. In the third operation embodiment, the negative side read voltage Vrn is used as a read voltage.

When writing data "1" to the selected cell, the negative side write voltage Vwn is applied to the upper electrode 30. The negative side write voltage Vwn is a voltage lower than the second negative voltage side threshold voltage Vtnn. By applying the negative side write voltage Vwn to the upper electrode 30, a high resistance state is realized on the negative voltage side, and data "1" is written to the selected cell.

When writing data "0" to the selected cell, the positive side write voltage Vwp is applied to the upper electrode 30. The positive side write voltage Vwp is a voltage higher than the second positive voltage side threshold voltage Vtnp. By applying the positive side write voltage Vwp to the upper electrode 30, a low resistance state is realized on the negative voltage side, and data "0" is written to the selected cell.

In the third operation embodiment, when writing data "1" to the selected cell, if the data stored in the selected cell is data "0", a current flows if the negative side write voltage Vwn is lower than the first negative voltage side threshold voltage Vtpn even if the negative side write voltage Vwn is higher than the second negative voltage side threshold voltage Vtnn. For this reason, data "1" may be written. Therefore, for example, by setting the negative side write voltage Vwn to a voltage between the second negative voltage side threshold voltage Vtnn and the first negative voltage side threshold voltage Vtpn, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the first positive voltage side threshold voltage Vtpp. In addition, the voltage Vwn/2 is higher than the first negative voltage side threshold voltage Vtpn.

Therefore, even when the half-selected cell is in the low resistance state, the half-select leakage current flowing through the half-selected cell can be suppressed. As a result, the memory element also functions as a switching element.

When reading data from the selected cell, the negative side read voltage Vrn is applied to the selected cell. The data of the selected cell can be determined by detecting a current change or a potential change caused by the difference between a current that flows when data is "1" and a current that flows when data is "0".

In addition, in the case of the third operation embodiment, when the data of the selected cell is data "1", the application of the negative side read voltage Vrn does not destroy the data. In other words, in the case of the third operation embodiment, non-destructive reading is possible if the data of the selected cell is data "1".

On the other hand, when the data of the selected cell is data "0", the application of the negative side read voltage Vrn lower than the first negative voltage side threshold voltage Vtpn may cause a current to flow. As a result, the data of the selected cell may change to data "1". In other words, in the case of the third operation embodiment, when the data of the selected cell is data "0", there is a possibility of destructive reading. Therefore, when the data of the selected cell is data "0", it may be necessary to rewrite the data "0" in order to maintain the data of the selected cell after reading the data of the selected cell.

Figure 15:
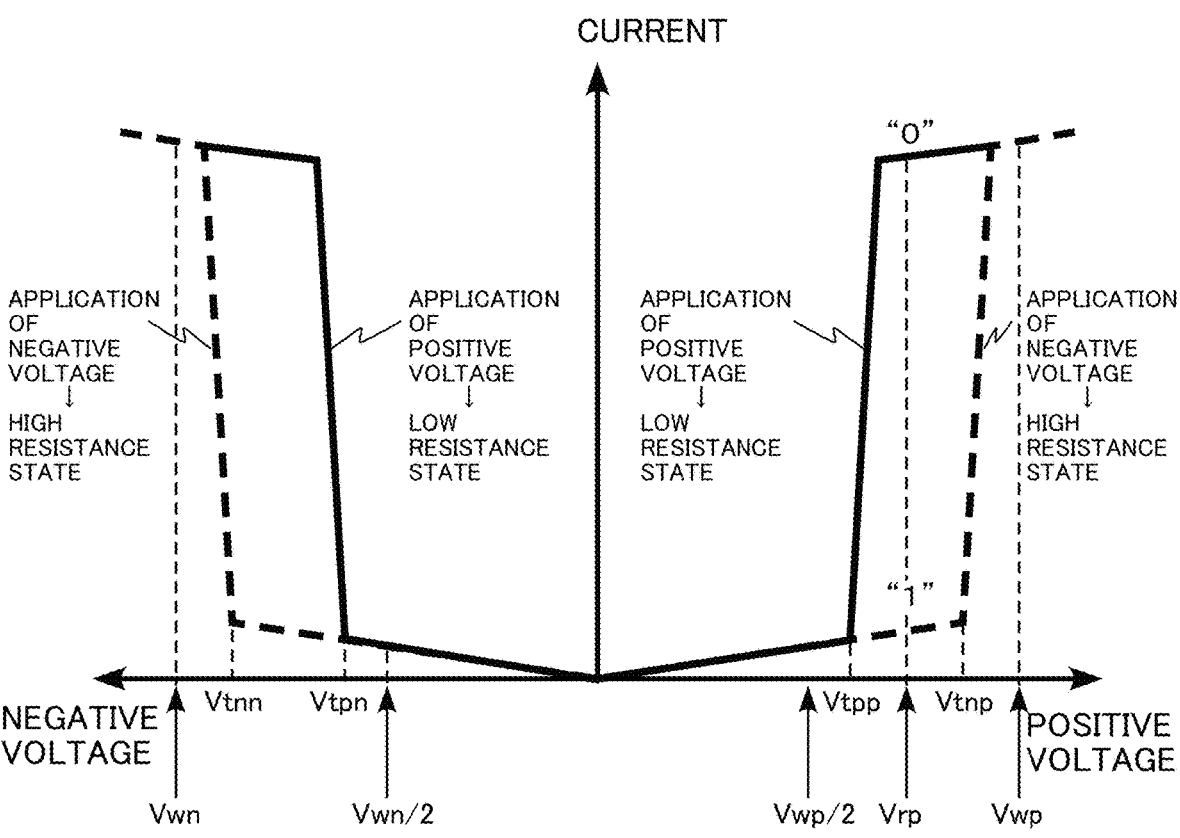
FIG. 15 is an explanatory diagram of a fourth operation embodiment of the memory operation in the memory device according to the first further embodiment of the third embodiment.

FIG. 15 is an explanatory diagram of a fourth operation embodiment of the memory operation in the memory device according to the first further embodiment of the third embodiment. FIG. 15 shows a positive side write voltage Vwp, half (Vwp/2) the positive side write voltage Vwp, a negative side write voltage Vwn, half (Vwn/2) the negative side write voltage Vwn, and a positive side read voltage Vrp when performing a memory operation.

In the fourth operation embodiment, the high resistance state and the low resistance state on the positive voltage side are used for the memory operation. In the fourth operation embodiment, the positive side read voltage Vrp is used as a read voltage.

When writing data "1" to the selected cell, the negative side write voltage Vwn is applied to the upper electrode 30. The negative side write voltage Vwn is a voltage lower than the second negative voltage side threshold voltage Vtnn. By applying the negative side write voltage Vwn to the upper electrode 30, a high resistance state is realized on the positive voltage side, and data "1" is written to the selected cell.

When writing data "0" to the selected cell, the positive side write voltage Vwp is applied to the upper electrode 30. The positive side write voltage Vwp is a voltage higher than the second positive voltage side threshold voltage Vtnp. By applying the positive side write voltage Vwp to the upper electrode 30, a low resistance state is realized on the positive voltage side, and data "0" is written to the selected cell.

In the fourth operation embodiment, when writing data "1" to the selected cell, if the data stored in the selected cell is data "0", a current flows if the negative side write voltage Vwn is lower than the first negative voltage side threshold voltage Vtpn even if the negative side write voltage Vwn is higher than the second negative voltage side threshold voltage Vtnn. For this reason, data "1" may be written. Therefore, for example, by setting the negative side write voltage Vwn to a voltage between the second negative voltage side threshold voltage Vtnn and the first negative voltage side threshold voltage Vtpn, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the first positive voltage side threshold voltage Vtpp. In addition, the voltage Vwn/2 is higher than the first negative voltage side threshold voltage Vtpn.

Therefore, even when the half-selected cell is in the low resistance state, the half-select leakage current flowing through the half-selected cell can be suppressed. As a result, the memory element also functions as a switching element.

When reading data from the selected cell, the positive side read voltage Vrp is applied to the selected cell. The data of the selected cell can be determined by detecting a current change or a potential change caused by the difference between a current that flows when data is "1" and a current that flows when data is "0".

In addition, in the case of the fourth operation embodiment, regardless of whether the data of the selected cell is data "1" or data "0", the application of the positive side read voltage Vrp does not destroy the data. In other words, in the case of the fourth operation embodiment, non-destructive reading is possible regardless of whether the data of the selected cell is data "1" or data "0".

Second Modification Example

A memory device according to a second further embodiment of the third embodiment is different from the memory device according to the third embodiment in that the current-voltage characteristics of the memory elements are different.

Figure 16:
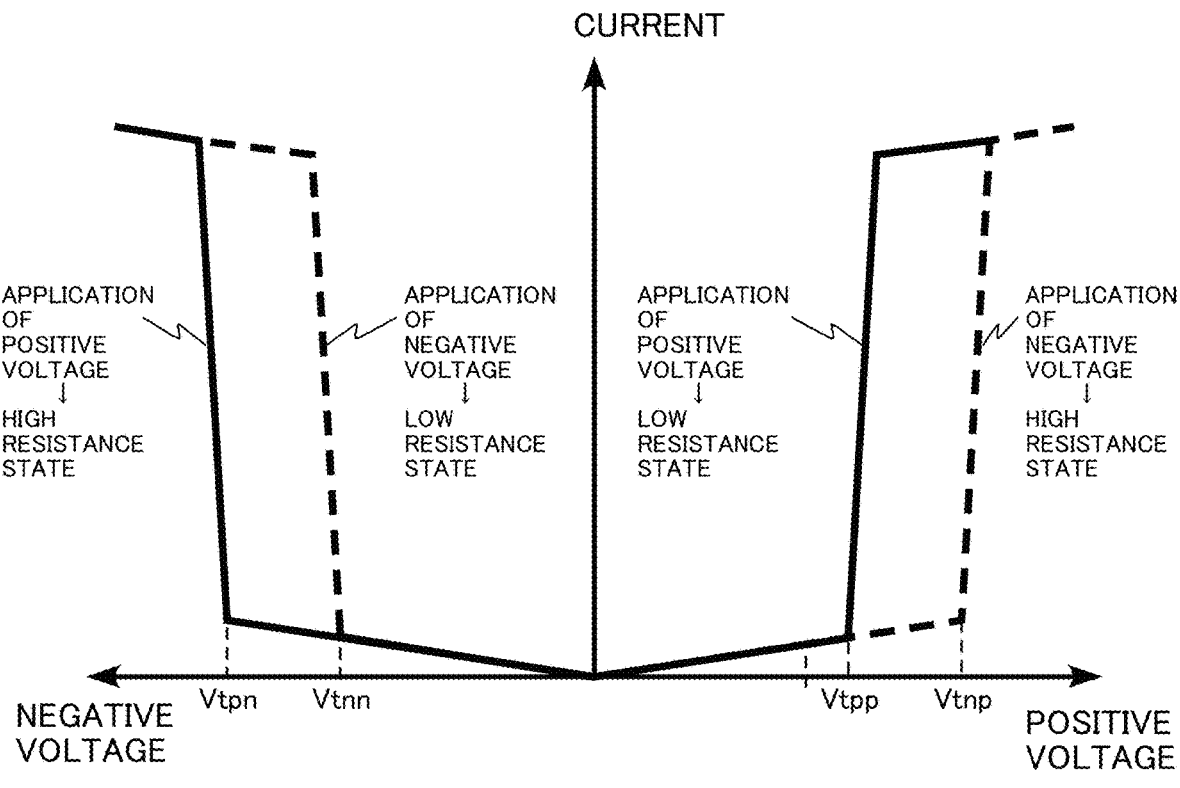
FIG. 16 is an explanatory diagram of the current-voltage characteristics of a memory element according to a second further embodiment of the third embodiment.

FIG. 16 is an explanatory diagram of the current-voltage characteristics of a memory element according to the second further embodiment of the third embodiment. The horizontal axis indicates a voltage applied to the memory element, and the vertical axis indicates a current flowing through the memory element. In FIG. 16, the horizontal axis indicates a voltage applied to the upper electrode 30 with the potential of the lower electrode 10 as a reference. FIG. 16 shows the current-voltage characteristics of the memory layer 60 in the second further embodiment of the third embodiment. FIG. 16 shows the current-voltage characteristics of the memory cell MC in the second further embodiment of the third embodiment.

The memory element according to the second further embodiment of the third embodiment shows different current-voltage characteristics when a predetermined positive voltage is applied to the upper electrode 30 and when a predetermined negative voltage is applied to the upper electrode 30. In FIG. 16, the solid line indicates the current-voltage characteristics when a predetermined positive voltage is applied to the upper electrode 30, and the dotted line indicates the current-voltage characteristics when a predetermined negative voltage is applied to the upper electrode 30.

When a predetermined positive voltage is applied to the upper electrode 30, the current increases abruptly at the first positive voltage side threshold voltage Vtpp on the positive voltage side. In addition, when a predetermined positive voltage is applied to the upper electrode 30, the current increases abruptly at the first negative voltage side threshold voltage Vtpn on the negative voltage side.

On the other hand, when a predetermined negative voltage is applied to the upper electrode 30, the current increases abruptly at the second positive voltage side threshold voltage Vtnp on the positive voltage side. In addition, when a predetermined negative voltage is applied to the upper electrode 30, the current increases abruptly at the second negative voltage side threshold voltage Vtnn on the negative voltage side.

The first positive voltage side threshold voltage Vtpp is lower than the second positive voltage side threshold voltage Vtnp. In addition, the first negative voltage side threshold voltage Vtpn is lower than the second negative voltage side threshold voltage Vtnn.

The memory element according to the second further embodiment of the third embodiment can have a high resistance state and a low resistance state on both the positive voltage side and the negative voltage side. When a predetermined positive voltage is applied to the upper electrode 30, a low resistance state is realized on the positive voltage side and a high resistance state is realized on the negative voltage side. On the other hand, when a predetermined negative voltage is applied to the upper electrode 30, a high resistance state is realized on the positive voltage side and a low resistance state is realized on the negative voltage side. Hereinafter, the high resistance state will be defined as data "1", and the low resistance state will be defined as data "0". The memory cell MC can store 1-bit data of "0" and "1".

Figure 17:
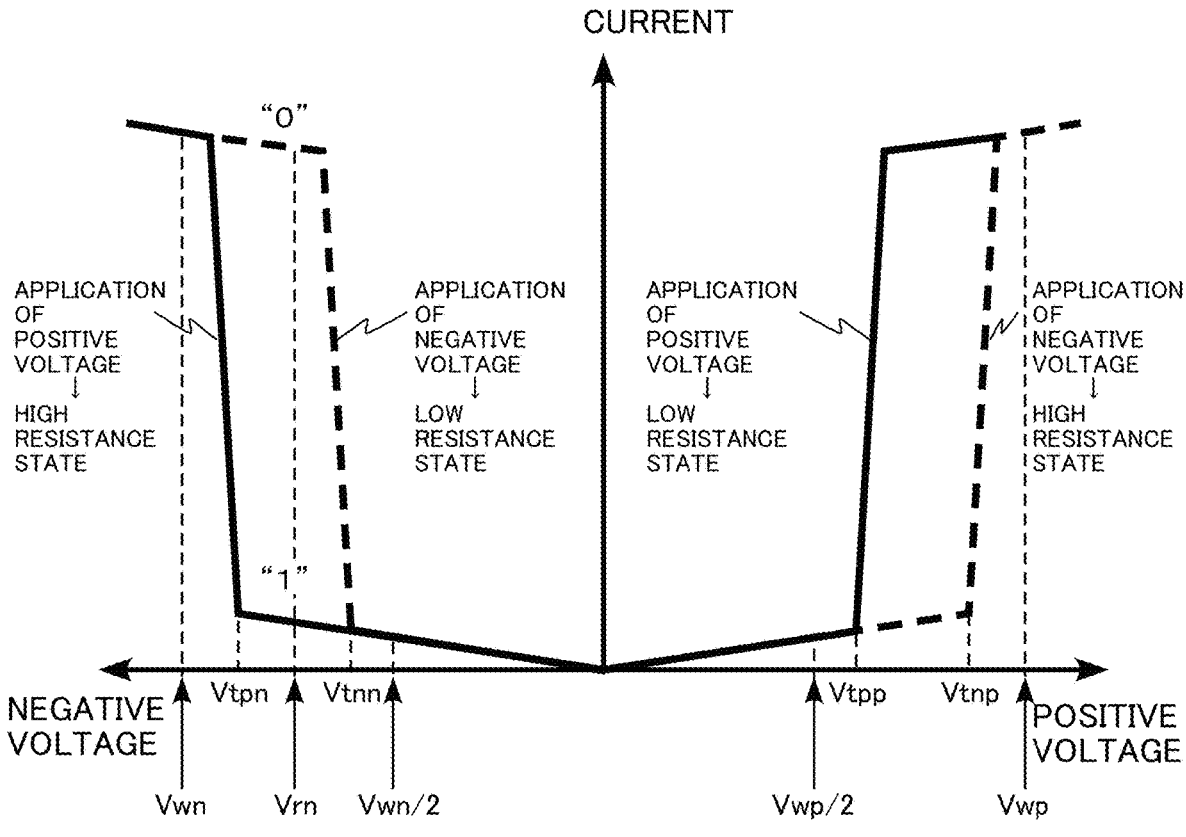
FIG. 17 is an explanatory diagram of a fifth operation embodiment of a memory operation in a memory device according to the second further embodiment of the third embodiment.

FIG. 17 is an explanatory diagram of a fifth operation embodiment of the memory operation in the memory device according to the second further embodiment of the third embodiment. FIG. 17 shows a positive side write voltage Vwp, half (Vwp/2) the positive side write voltage Vwp, a negative side write voltage Vwn, half (Vwn/2) the negative side write voltage Vwn, and a negative side read voltage Vrn when performing a memory operation.

In the fifth operation embodiment, the high resistance state and the low resistance state on the negative voltage side are used for the memory operation. In the fifth operation embodiment, the negative side read voltage Vrn is used as a read voltage.

When writing data "1" to the selected cell, the positive side write voltage Vwp is applied to the upper electrode 30. The positive side write voltage Vwp is a voltage higher than the second positive voltage side threshold voltage Vtnp. By applying the positive side write voltage Vwp to the upper electrode 30, a high resistance state is realized on the negative voltage side, and data "1" is written to the selected cell.

When writing data "0" to the selected cell, the negative side write voltage Vwn is applied to the upper electrode 30. The negative side write voltage Vwn is a voltage lower than the first negative voltage side threshold voltage Vtpn. By applying the negative side write voltage Vwn to the upper electrode 30, a low resistance state is realized on the negative voltage side, and data "0" is written to the selected cell.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the first positive voltage side threshold voltage Vtpp. In addition, the voltage Vwn/2 is higher than the second negative voltage side threshold voltage Vtnn.

Therefore, even when the half-selected cell is in the low resistance state, the half-select leakage current flowing through the half-selected cell can be suppressed. As a result, the memory element also functions as a switching element.

When reading data from the selected cell, the negative side read voltage Vrn is applied to the selected cell. The data of the selected cell can be determined by detecting a current change or a potential change caused by the difference between a current that flows when data is "1" and a current that flows when data is "0".

In addition, in the case of the fifth operation embodiment, regardless of whether the data of the selected cell is data "1" or data "0", the application of the negative side read voltage Vrn does not destroy the data. In other words, in the case of the fifth operation embodiment, non-destructive reading is possible regardless of whether the data of the selected cell is data "1" or data "0".

Figure 18:
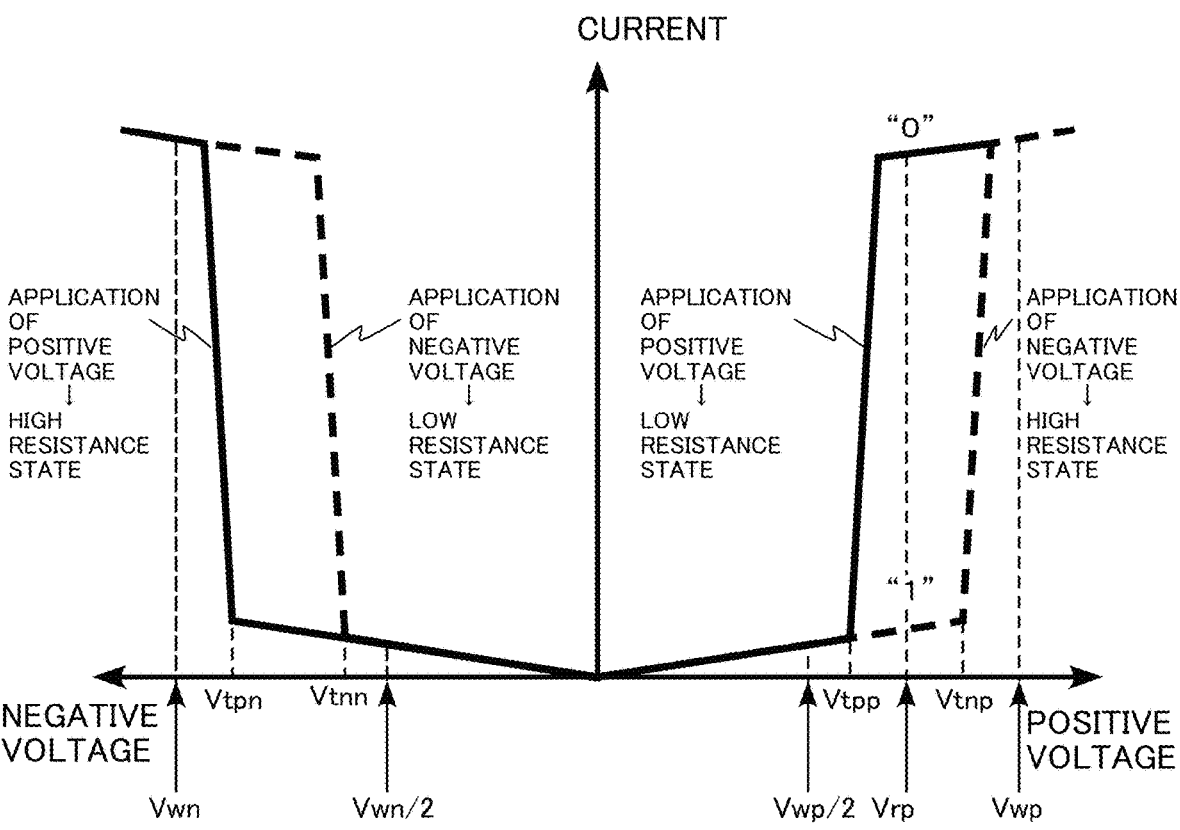
FIG. 18 is an explanatory diagram of a sixth operation embodiment of the memory operation in the memory device according to the second further embodiment of the third embodiment.

FIG. 18 is an explanatory diagram of a sixth operation embodiment of the memory operation in the memory device according to the second further embodiment of the third embodiment. FIG. 18 shows a positive side write voltage Vwp, half (Vwp/2) the positive side write voltage Vwp, a negative side write voltage Vwn, half (Vwn/2) the negative side write voltage Vwn, and a positive side read voltage Vrp when performing a memory operation.

In the sixth operation embodiment, the high resistance state and the low resistance state on the positive voltage side are used for the memory operation. In the sixth operation embodiment, the positive side read voltage Vrp is used as a read voltage.

When writing data "1" to the selected cell, the negative side write voltage Vwn is applied to the upper electrode 30. The negative side write voltage Vwn is a voltage lower than the first negative voltage side threshold voltage Vtpn. By applying the negative side write voltage Vwn to the upper electrode 30, a high resistance state is realized on the positive voltage side, and data "1" is written to the selected cell.

When writing data "0" to the selected cell, the positive side write voltage Vwp is applied to the upper electrode 30. The positive side write voltage Vwp is a voltage higher than the second positive voltage side threshold voltage Vtnp. By applying the positive side write voltage Vwp to the upper electrode 30, a low resistance state is realized on the positive voltage side, and data "0" is written to the selected cell.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the first positive voltage side threshold voltage Vtpp. In addition, the voltage Vwn/2 is higher than the second negative voltage side threshold voltage Vtnn.

Therefore, even when the half-selected cell is in the low resistance state, the half-select leakage current flowing through the half-selected cell can be suppressed. As a result, the memory element also functions as a switching element.

When reading data from the selected cell, the positive side read voltage Vrp is applied to the selected cell. The data of the selected cell can be determined by detecting a current change or a potential change caused by the difference between a current that flows when data is "1" and a current that flows when data is "0".

In addition, in the case of the sixth operation embodiment, regardless of whether the data of the selected cell is data "1" or data "0", the application of the positive side read voltage Vrp does not destroy the data. In other words, in the case of the sixth operation embodiment, non-destructive reading is possible regardless of whether the data of the selected cell is data "1" or data "0".

Third Modification Example

A memory device according to a third further embodiment of the third embodiment is different from the memory device according to the third embodiment in that the current-voltage characteristics of the memory elements are different.

Figure 19:
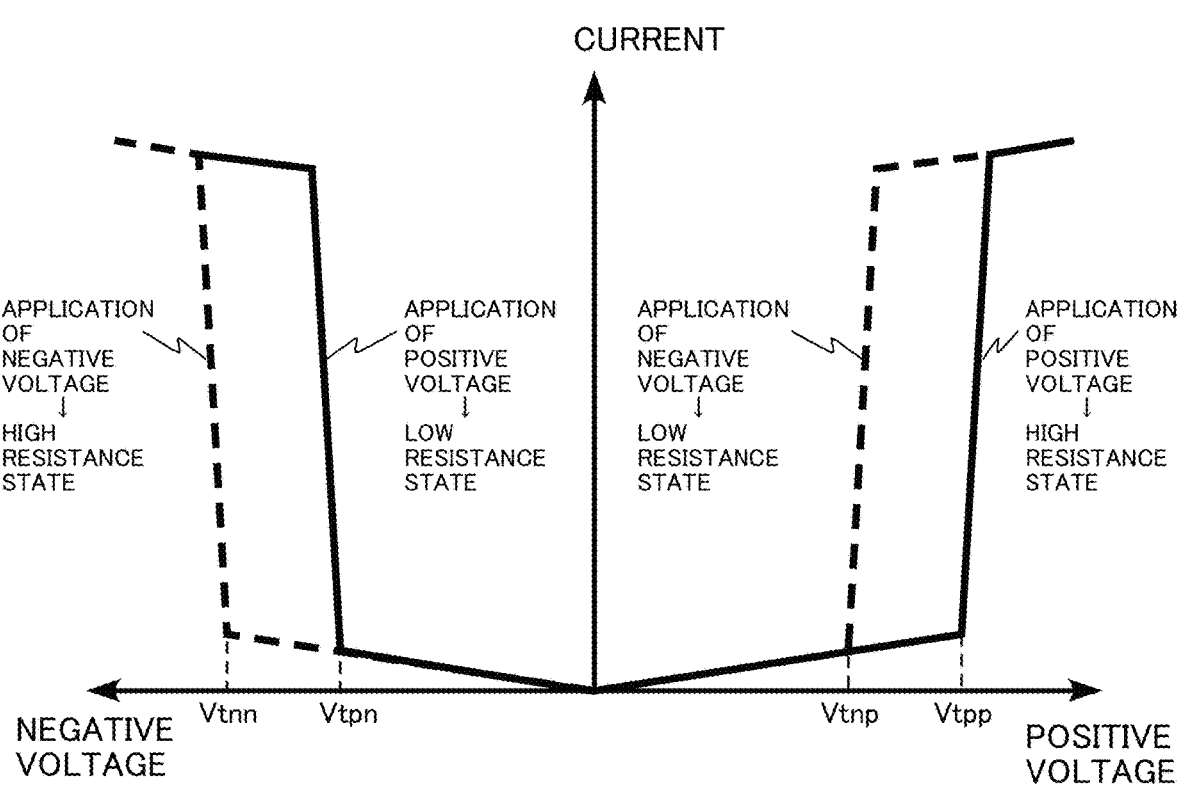
FIG. 19 is an explanatory diagram of the current-voltage characteristics of a memory element according to a third further embodiment of the third embodiment.

FIG. 19 is an explanatory diagram of the current-voltage characteristics of a memory element according to the third further embodiment of the third embodiment. The horizontal axis indicates a voltage applied to the memory element, and the vertical axis indicates a current flowing through the memory element. In FIG. 19, the horizontal axis indicates a voltage applied to the upper electrode 30 with the potential of the lower electrode 10 as a reference. FIG. 19 shows the current-voltage characteristics of the memory layer 60 in the third further embodiment of the third embodiment. FIG. 19 shows the current-voltage characteristics of the memory cell MC in the third further embodiment of the third embodiment.

The memory element according to the third further embodiment of the third embodiment shows different current-voltage characteristics when a predetermined positive voltage is applied to the upper electrode 30 and when a predetermined negative voltage is applied to the upper electrode 30. In FIG. 19, the solid line indicates the current-voltage characteristics when a predetermined positive voltage is applied to the upper electrode 30, and the dotted line indicates the current-voltage characteristics when a predetermined negative voltage is applied to the upper electrode 30.

When a predetermined positive voltage is applied to the upper electrode 30, the current increases abruptly at the first positive voltage side threshold voltage Vtpp on the positive voltage side. In addition, when a predetermined positive voltage is applied to the upper electrode 30, the current increases abruptly at the first negative voltage side threshold voltage Vtpn on the negative voltage side.

On the other hand, when a predetermined negative voltage is applied to the upper electrode 30, the current increases abruptly at the second positive voltage side threshold voltage Vtnp on the positive voltage side. In addition, when a predetermined negative voltage is applied to the upper electrode 30, the current increases abruptly at the second negative voltage side threshold voltage Vtnn on the negative voltage side.

The first positive voltage side threshold voltage Vtpp is higher than the second positive voltage side threshold voltage Vtnp. In addition, the first negative voltage side threshold voltage Vtpn is higher than the second negative voltage side threshold voltage Vtnn.

The memory element according to the third further embodiment of the third embodiment can have a high resistance state and a low resistance state on both the positive voltage side and the negative voltage side. When a predetermined positive voltage is applied to the upper electrode 30, a high resistance state is realized on the positive voltage side and a low resistance state is realized on the negative voltage side. On the other hand, when a predetermined negative voltage is applied to the upper electrode 30, a low resistance state is realized on the positive voltage side and a high resistance state is realized on the negative voltage side. Hereinafter, the high resistance state will be defined as data "1", and the low resistance state will be defined as data "0". The memory cell MC can store 1-bit data of "0" and "1".

Figure 20:
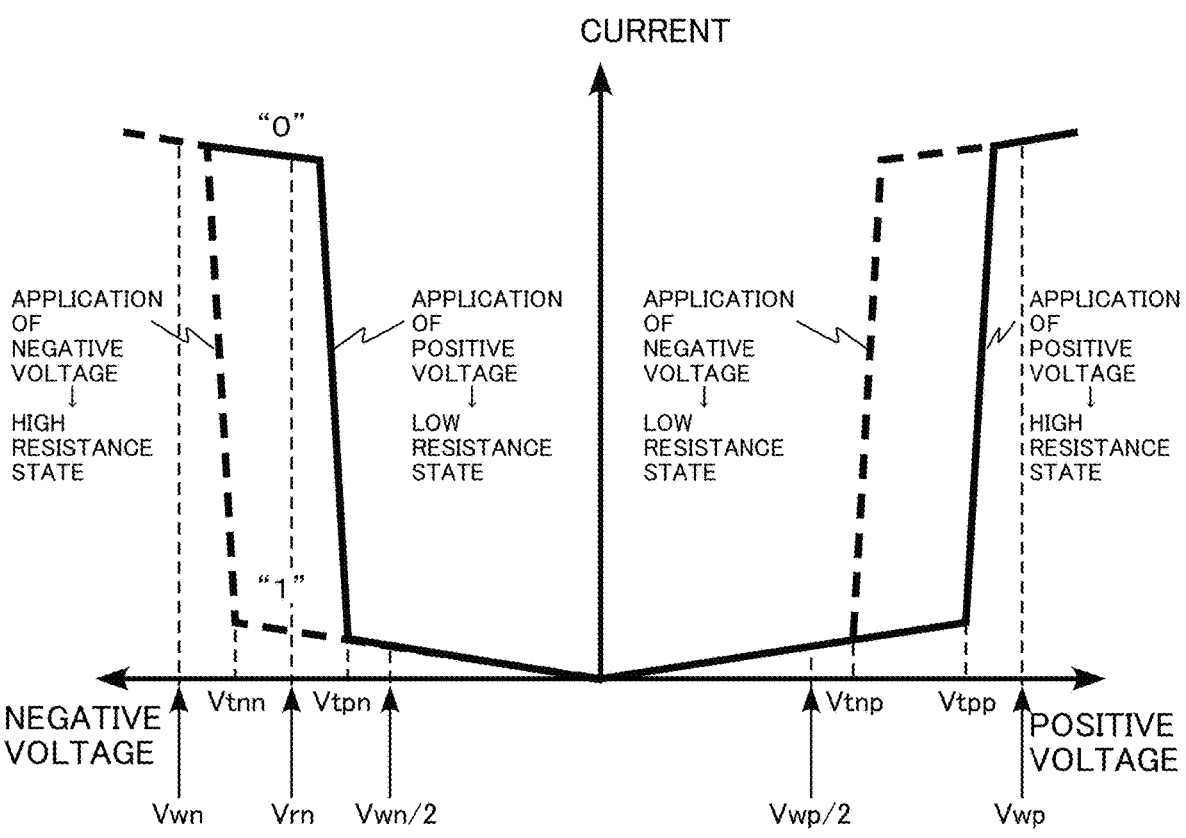
FIG. 20 is an explanatory diagram of a seventh operation embodiment of a memory operation in a memory device according to the third further embodiment of the third embodiment.

FIG. 20 is an explanatory diagram of a seventh operation embodiment of the memory operation in the memory device according to the third further embodiment of the third embodiment. FIG. 20 shows a positive side write voltage Vwp, half (Vwp/2) the positive side write voltage Vwp, a negative side write voltage Vwn, half (Vwn/2) the negative side write voltage Vwn, and a negative side read voltage Vrn when performing a memory operation.

In the seventh operation embodiment, the high resistance state and the low resistance state on the negative voltage side are used for the memory operation. In the seventh operation embodiment, the negative side read voltage Vrn is used as a read voltage.

When writing data "1" to the selected cell, the negative side write voltage Vwn is applied to the upper electrode 30. The negative side write voltage Vwn is a voltage lower than the second negative voltage side threshold voltage Vtnn. By applying the negative side write voltage Vwn to the upper electrode 30, a high resistance state is realized on the negative voltage side, and data "1" is written to the selected cell.

When writing data "0" to the selected cell, the positive side write voltage Vwp is applied to the upper electrode 30. The positive side write voltage Vwp is a voltage higher than the first positive voltage side threshold voltage Vtpp. By applying the positive side write voltage Vwp to the upper electrode 30, a low resistance state is realized on the negative voltage side, and data "0" is written to the selected cell.

In the seventh operation embodiment, when writing data "1" to the selected cell, if the data stored in the selected cell is data "0", a current flows if the negative side write voltage Vwn is lower than the first negative voltage side threshold voltage Vtpn even if the negative side write voltage Vwn is higher than the second negative voltage side threshold voltage Vtnn. For this reason, data "1" may be written. Therefore, for example, by setting the negative side write voltage Vwn to a voltage between the second negative voltage side threshold voltage Vtnn and the first negative voltage side threshold voltage Vtpn, it is possible to reduce the power consumption of the memory device or increase the reliability.

In addition, in the seventh operation embodiment, when writing data "0" to the selected cell, if the data stored in the selected cell is data "1", a current flows if the positive side write voltage Vwp is higher than the second positive voltage side threshold voltage Vtnp even if the positive side write voltage Vwp is lower than the first positive voltage side threshold voltage Vtpp. For this reason, data "0" may be written. Therefore, for example, by setting the positive side write voltage Vwp to a voltage between the second positive voltage side threshold voltage Vtnp and the first positive voltage side threshold voltage Vtpp, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the second positive voltage side threshold voltage Vtnp. In addition, the voltage Vwn/2 is higher than the first negative voltage side threshold voltage Vtpn.

Therefore, even when the half-selected cell is in the low resistance state, the half-select leakage current flowing through the half-selected cell can be suppressed. As a result, the memory element also functions as a switching element.

When reading data from the selected cell, the negative side read voltage Vrn is applied to the selected cell. The data of the selected cell can be determined by detecting a current change or a potential change caused by the difference between a current that flows when data is "1" and a current that flows when data is "0".

In addition, in the case of the seventh operation embodiment, when the data of the selected cell is data "1", the application of the negative side read voltage Vrn does not destroy the data. In other words, in the case of the seventh operation embodiment, non-destructive reading is possible if the data of the selected cell is data "1".

On the other hand, when the data of the selected cell is data "0", the application of the negative side read voltage Vrn lower than the first negative voltage side threshold voltage Vtpn may cause a current to flow. As a result, the data of the selected cell may change to data "1". In other words, in the case of the seventh operation embodiment, when the data of the selected cell is data "0", there is a possibility of destructive reading. Therefore, when the data of the selected cell is data "0", it may be necessary to rewrite the data "0" in order to maintain the data of the selected cell after reading the data of the selected cell.

Figure 21:
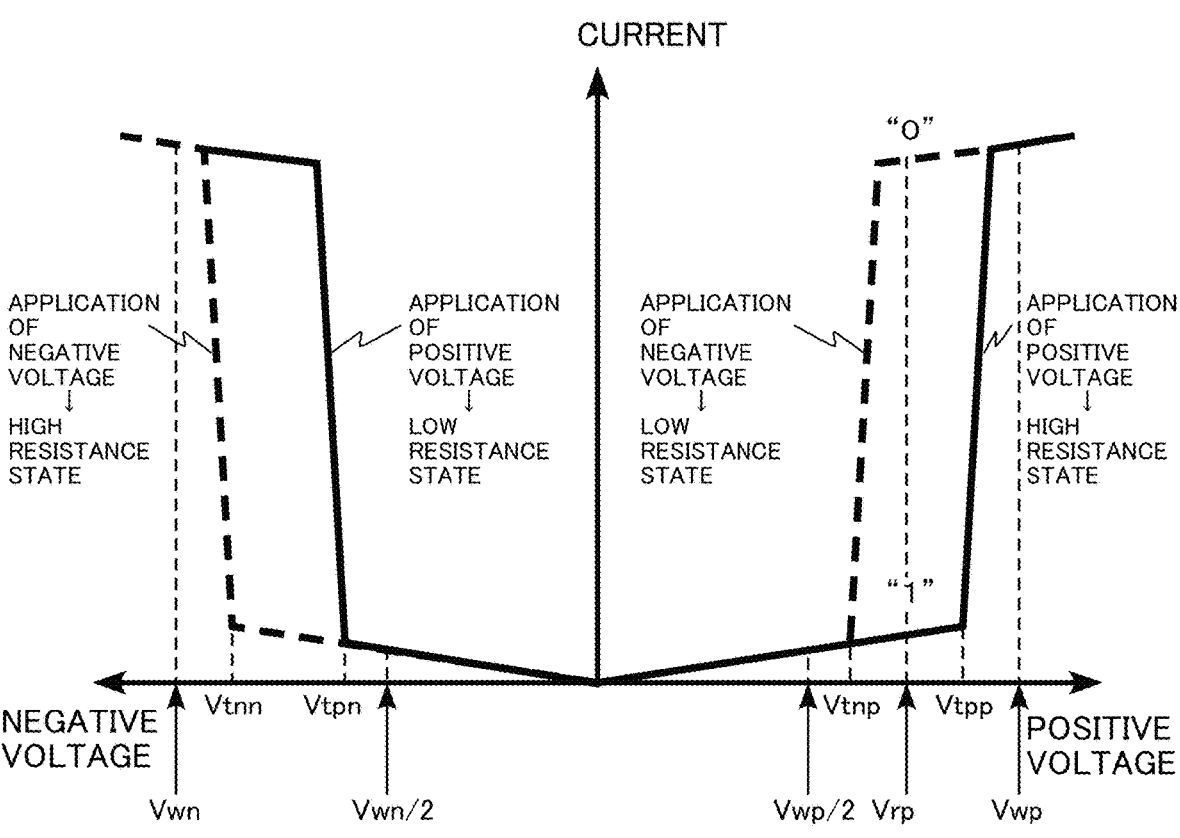
FIG. 21 is an explanatory diagram of an eighth operation embodiment of the memory operation in the memory device according to the third further embodiment of the third embodiment.

FIG. 21 is an explanatory diagram of an eighth operation embodiment of the memory operation in the memory device according to the third further embodiment of the third embodiment. FIG. 21 shows a positive side write voltage Vwp, half (Vwp/2) the positive side write voltage Vwp, a negative side write voltage Vwn, half (Vwn/2) the negative side write voltage Vwn, and a positive side read voltage Vrp when performing a memory operation.

In the eighth operation embodiment, the high resistance state and the low resistance state on the positive voltage side are used for the memory operation. In the eighth operation embodiment, the positive side read voltage Vrp is used as a read voltage.

When writing data "1" to the selected cell, the positive side write voltage Vwp is applied to the upper electrode 30. The positive side write voltage Vwp is a voltage higher than the first positive voltage side threshold voltage Vtpp. By applying the positive side write voltage Vwp to the upper electrode 30, a high resistance state is realized on the positive voltage side, and data "1" is written to the selected cell.

When writing data "0" to the selected cell, the negative side write voltage Vwn is applied to the upper electrode 30. The negative side write voltage Vwn is a voltage lower than the second negative voltage side threshold voltage Vtnn. By applying the negative side write voltage Vwn to the upper electrode 30, a low resistance state is realized on the positive voltage side, and data "0" is written to the selected cell.

In the eighth operation embodiment, when writing data "1" to the selected cell, if the data stored in the selected cell is data "0", a current flows if the positive side write voltage Vwp is higher than the second positive voltage side threshold voltage Vtnp even if the positive side write voltage Vwp is lower than the first positive voltage side threshold voltage Vtpp. For this reason, data "1" may be written. Therefore, for example, by setting the positive side write voltage Vwp to a voltage between the second positive voltage side threshold voltage Vtnp and the first positive voltage side threshold voltage Vtpp, it is possible to reduce the power consumption of the memory device or increase the reliability.

In addition, in the eighth operation embodiment, when writing data "0" to the selected cell, if the data stored in the selected cell is data "1", a current flows if the negative side write voltage Vwn is lower than the first negative voltage side threshold voltage Vtpn even if the negative side write voltage Vwn is higher than the second negative voltage side threshold voltage Vtnn. For this reason, data "0" may be written. Therefore, for example, by setting the negative side write voltage Vwn to a voltage between the second negative voltage side threshold voltage Vtnn and the first negative voltage side threshold voltage Vtpn, it is possible to reduce the power consumption of the memory device or increase the reliability.

In addition, when the positive side write voltage Vwp is applied to the selected cell, the voltage Vwp/2 is applied to the half-selected cell. In addition, when the negative side write voltage Vwn is applied to the selected cell, the voltage Vwn/2 is applied to the half-selected cell. The voltage Vwp/2 is lower than the second positive voltage side threshold voltage Vtnp. In addition, the voltage Vwn/2 is higher than the first negative voltage side threshold voltage Vtpn.

Therefore, even when the half-selected cell is in the low resistance state, the half-select leakage current flowing through the half-selected cell can be suppressed. As a result, the memory element also functions as a switching element.

When reading data from the selected cell, the positive side read voltage Vrp is applied to the selected cell. The data of the selected cell can be determined by detecting a current change or a potential change caused by the difference between a current that flows when data is "1" and a current that flows when data is "0".

In addition, in the case of the eighth operation embodiment, when the data of the selected cell is data "1", the application of the positive side read voltage Vrp does not destroy the data. In other words, in the case of the eighth operation embodiment, non-destructive reading is possible if the data of the selected cell is data "1".

On the other hand, when the data of the selected cell is data "0", the application of the positive side read voltage Vrp higher than the second positive voltage side threshold voltage Vtnp may cause a current to flow. As a result, the data of the selected cell may change to data "1". In other words, in the case of the eighth operation embodiment, when the data of the selected cell is data "0", there is a possibility of destructive reading. Therefore, when the data of the selected cell is data "0", it may be necessary to rewrite the data "0" in order to maintain the data of the selected cell after reading the data of the selected cell.

In the memory devices according to the third embodiment and its further embodiments, the memory element of the memory cell MC has a switching function and an information storage function. The memory layer 60 is a single layer and realizes the function of the switching layer 50 and the function of the resistance change layer 40 in the first and second embodiments. Since the memory layer 60 in the third embodiment is a single layer and has a switching function and a memory function, the structure of the memory cell MC can be made very simple.

In addition, the memory layer 60 of each memory device according to the third embodiment and its further embodiments has the same configuration as the switching layer 50 in the first and second embodiments. Therefore, according to the third embodiment and its further embodiments, as in the first and second embodiments, it is possible to realize a memory device having excellent switching characteristics such as low half-select leakage current and high reliability.

In addition, the plurality of current-voltage characteristics of the memory elements shown in the third embodiment and its further embodiments can be realized, for example, by adopting the memory layer 60 having an appropriate chemical composition.

Although the magnetoresistive memory has been described as an example of the two-terminal memory device in the first embodiment and the resistive memory has been described as an example of the memory device in the second embodiment, embodiments can be applied to other two-terminal memory devices. For example, embodiments can be applied to a phase change memory (PCM) or a ferroelectric random access memory (FeRAM).

While certain embodiments have been described, these embodiments have been presented by way of example only, and are not intended to limit the scope of the inventions. Indeed, the memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Technical aspects of the inventions will be described below. The technical aspects described below are within the scope of the inventions.

Clause 1. A memory device, comprising:

a memory cell including a first conductive layer, a second conductive layer, and a memory layer provided between the first conductive layer and the second conductive layer, wherein the memory layer contains:

at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element;

a second substance being at least one metal selected from a group consisting of tellurium (Te), selenium (Se), antimony (Sb), bismuth (Bi), germanium (Ge), and tin (Sn); and at least one third substance selected from a group consisting of oxide of the second substance, nitride of the second substance, and oxynitride of the second substance.

Clause 2. The memory device according to clause 1, wherein a molar fraction of the first substance contained in the memory layer is larger than a molar fraction of the third substance contained in the memory layer.

Clause 3. The memory device according to clause 1, wherein a molar fraction of the first substance contained in the memory layer is 50 mol % or more.

Clause 4. The memory device according to clause 1, wherein a molar fraction of the second substance contained in the memory layer is 5 mol % or more.

Clause 5. The memory device according to clause 1, wherein a molar fraction of the third substance contained in the memory layer is 5 mol % or more.

Clause 6. The memory device according to clause 1, wherein the second substance contains two or more kinds of metals selected from a group consisting of tellurium (Te), selenium (Se), antimony (Sb), bismuth (Bi), germanium (Ge), and tin (Sn).

Clause 7. The memory device according to clause 1, wherein the first substance contained in the memory layer is yttrium oxide, zirconium oxide, or lanthanum oxide.

Clause 8. The memory device according to clause 1, wherein the first conductive layer contains carbon or tungsten nitride, and the second conductive layer contains carbon or tungsten nitride.

Clause 9. The memory device according to clause 1, further comprising:

a first layer provided between the first conductive layer and the memory layer and containing carbon or tungsten nitride; and a second layer provided between the second conductive layer and the memory layer and containing carbon or tungsten nitride.

Clause 10. The memory device according to clause 1, wherein a melting point of the first substance is higher than a melting point of the third substance.

Clause 11. The memory device according to clause 1, wherein an absolute value of standard Gibbs energy of formation of the first substance is larger than an absolute value of standard Gibbs energy of formation of the third substance.

Clause 12. The memory device according to clause 1, wherein the memory layer has a nonlinear current-voltage characteristic in which a current increases at a specific threshold voltage, and the threshold voltage is changed with application of a predetermined voltage.

Clause 13. The memory device according to clause 1, further comprising:

a plurality of first wirings; and a plurality of second wirings crossing the plurality of first wirings, wherein the memory cell is provided in a region where one of the plurality of first wirings and one of the plurality of second wirings cross each other.

What is claimed is:

1. A memory device, comprising:

a first conductive layer;

a second conductive layer;

a third conductive layer;

a resistance change layer provided between the first conductive layer and the second conductive layer; and a switching layer provided between the second conductive layer and the third conductive layer, wherein the second conductive layer is provided between the first conductive layer and the third conductive layer, and the switching layer contains:

at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element;

a second substance being at least one substance selected from a group consisting of tellurium (Te), selenium (Se), antimony (Sb), bismuth (Bi), germanium (Ge), and tin (Sn), and the second substance being a conductor; and at least one third substance selected from a group consisting of oxide of the second substance, nitride of the second substance, and oxynitride of the second substance, and the at least one third substance being an insulator.

2. The memory device according to claim 1, wherein a molar fraction of the first substance contained in the switching layer is larger than a molar fraction of the third substance contained in the switching layer.

3. The memory device according to claim 1, wherein a molar fraction of the first substance contained in the switching layer is 50 mol % or more.

4. The memory device according to claim 1, wherein a molar fraction of the second substance contained in the switching layer is 5 mol % or more.

5. The memory device according to claim 1, wherein a molar fraction of the third substance contained in the switching layer is 5 mol % or more.

6. The memory device according to claim 1, wherein the second substance contains two or more kinds of substances selected from a group consisting of tellurium (Te), selenium (Se), antimony (Sb), bismuth (Bi), germanium (Ge), and tin (Sn).

7. The memory device according to claim 1, wherein the first substance contained in the switching layer is yttrium oxide, zirconium oxide, or lanthanum oxide.

8. The memory device according to claim 1, wherein the second conductive layer contains carbon or tungsten nitride, and the third conductive layer contains carbon or tungsten nitride.

9. The memory device according to claim 1, further comprising:

a first layer provided between the second conductive layer and the switching layer and containing carbon or tungsten nitride; and a second layer provided between the third conductive layer and the switching layer and containing carbon or tungsten nitride.

10. The memory device according to claim 1, wherein a melting point of the first substance is higher than a melting point of the third substance.

11. The memory device according to claim 1, wherein an absolute value of standard Gibbs energy of formation of the first substance is larger than an absolute value of standard Gibbs energy of formation of the third substance.

12. A memory device, comprising:

a plurality of first wirings;

a plurality of second wirings crossing the plurality of first wirings; and a memory cell located in a region where each of the first wirings and each of the second wirings cross each other, wherein the memory cell includes:

a first conductive layer;

a second conductive layer;

a third conductive layer;

a resistance change layer provided between the first conductive layer and the second conductive layer; and a switching layer provided between the second conductive layer and the third conductive layer, the second conductive layer is provided between the first conductive layer and the third conductive layer, and the switching layer contains:

at least one first substance selected from a group consisting of oxide of at least one element selected from a group consisting of chromium (Cr), lanthanum (La), cerium (Ce), yttrium (Y), scandium (Sc), zirconium (Zr), and hafnium (Hf), nitride of the at least one element, and oxynitride of the at least one element;

a second substance being at least one substance selected from a group consisting of tellurium (Te), selenium (Se), antimony (Sb), bismuth (Bi), germanium (Ge), and tin (Sn), and the second substance being a conductor; and at least one third substance selected from a group consisting of oxide of the second substance, nitride of the second substance, and oxynitride of the second substance, and the at least one third substance being an insulator.

13. The memory device according to claim 12, wherein a molar fraction of the first substance contained in the switching layer is larger than a molar fraction of the third substance contained in the switching layer.

14. The memory device according to claim 12, wherein a molar fraction of the first substance contained in the switching layer is 50 mol % or more.

15. The memory device according to claim 12, wherein a molar fraction of the second substance contained in the switching layer is 5 mol % or more.

16. The memory device according to claim 12, wherein a molar fraction of the third substance contained in the switching layer is 5 mol % or more.

17. The memory device according to claim 12, wherein the switching layer contains two or more kinds of the second substances.

18. The memory device according to claim 12, wherein the second conductive layer contains carbon or tungsten nitride, and the third conductive layer contains carbon or tungsten nitride.

19. The memory device according to claim 12, further comprising:

a first layer provided between the second conductive layer and the switching layer and containing carbon or tungsten nitride; and a second layer provided between the third conductive layer and the switching layer and containing carbon or tungsten nitride.

20. The memory device according to claim 12, wherein a melting point of the first substance is higher than a melting point of the third substance.

* * * * *